United States Patent [19]

Nishikawa

[11] Patent Number: 5,576,135
[45] Date of Patent: Nov. 19, 1996

[54] PROCESSING METHOD BASED ON RESIST PATTERN FORMATION, AND RESIST PATTERN FORMING APPARATUS

[75] Inventor: Masaji Nishikawa, Tokyo, Japan

[73] Assignee: Olympus Optical Co., Ltd., Tokyo, Japan

[21] Appl. No.: 402,107

[22] Filed: Mar. 10, 1995

[30] Foreign Application Priority Data

Mar. 29, 1994 [JP] Japan ................................... 6-059330

[51] Int. Cl.$^6$ .................................................... G03G 13/16
[52] U.S. Cl. ............................................. 430/126; 430/306
[58] Field of Search ............................. 430/49, 306, 126

[56] References Cited

U.S. PATENT DOCUMENTS

| | | | |
|---|---|---|---|
| 3,374,769 | 3/1968 | Carlson | 118/641 |
| 4,226,930 | 10/1980 | Takimoto et al. | 430/306 |
| 4,371,599 | 2/1983 | Lind et al. | 430/306 |
| 4,684,547 | 8/1987 | DiStefano et al. | 427/131 |
| 4,991,287 | 2/1991 | Piatt et al. | 29/840 |

*Primary Examiner*—John Goodrow
*Attorney, Agent, or Firm*—Frishauf, Holtz, Goodman, Langer & Chick, P.C.

[57] ABSTRACT

A processing method based on resist pattern formation, includes the steps of forming an electrostatic latent image on a photosensitive rotating drum, forming a toner image on the drum by developing the electrostatic latent image with a hot-melt toner, transferring the toner image on the drum onto a processing target member made of a material that is dissolved by an etchant, in accordance with hot-melt transfer, and processing the processing target member based on the toner image thereon as a resist pattern. The processing step has an etching step of causing the etchant to act on a surface of the processing target member on which the resist pattern has been transferred, thereby selectively etching the surface of the processing target member.

28 Claims, 16 Drawing Sheets

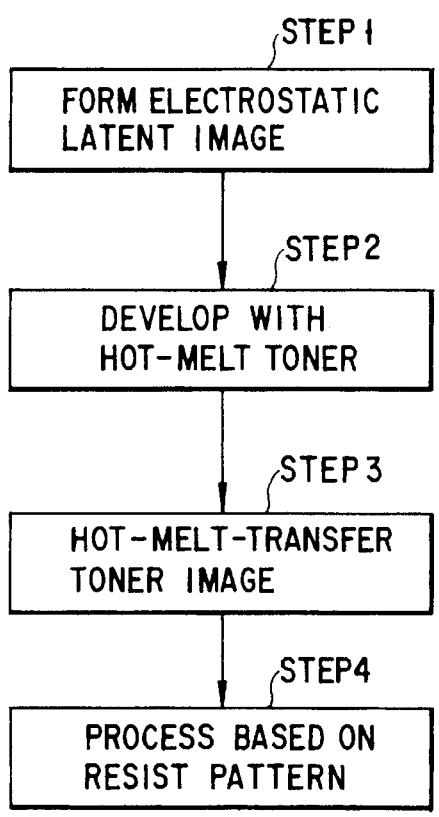
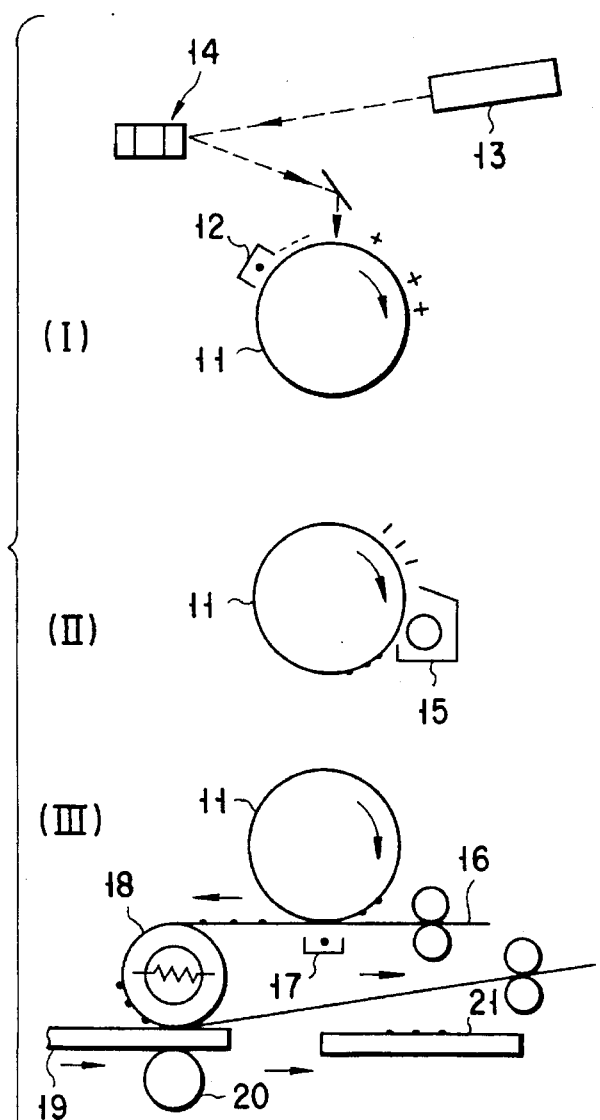
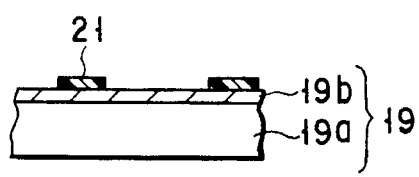
FIG. 1A
FIG. 1B
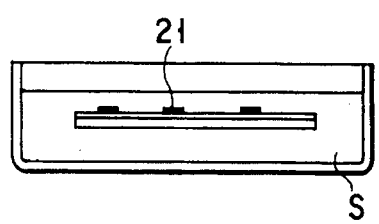
FIG. 2A
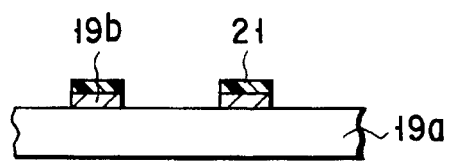
FIG. 2B
FIG. 2C

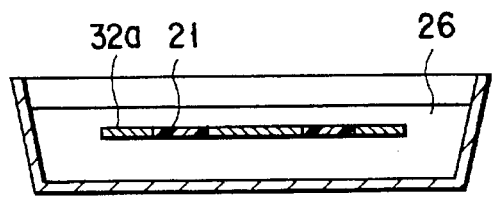
FIG. 7B
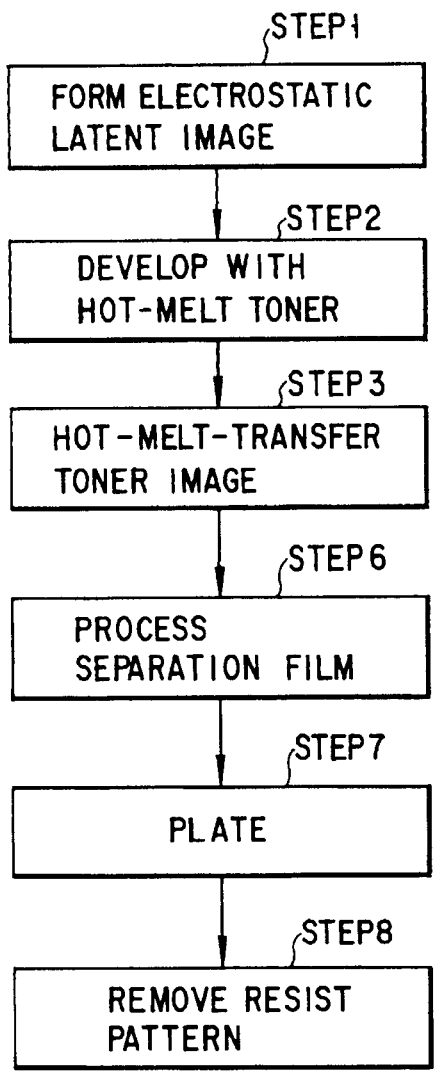
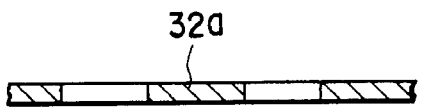
FIG. 7C
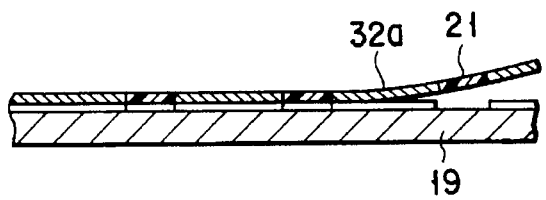
FIG. 8A
FIG. 7A
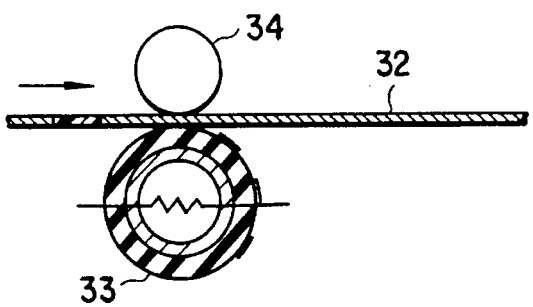
FIG. 8B

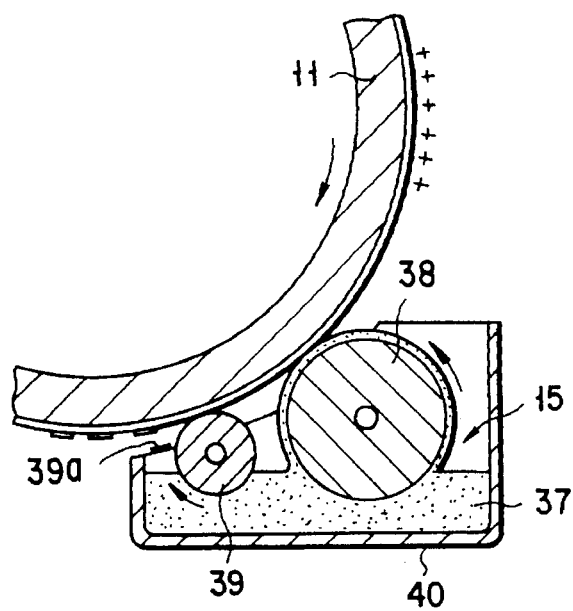
F I G. 9
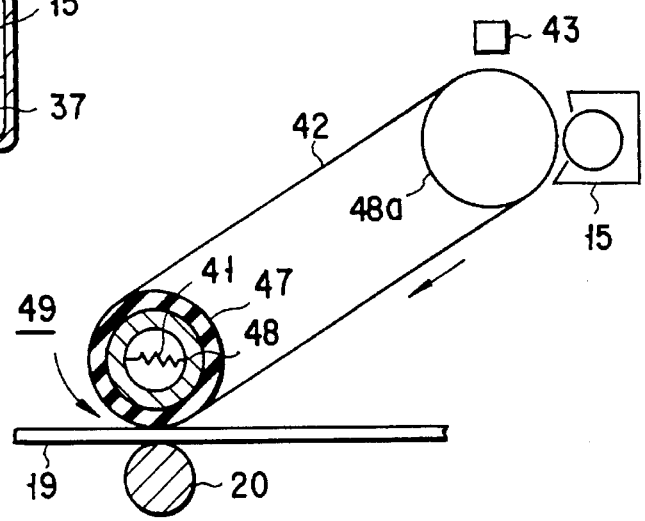
F I G. 10
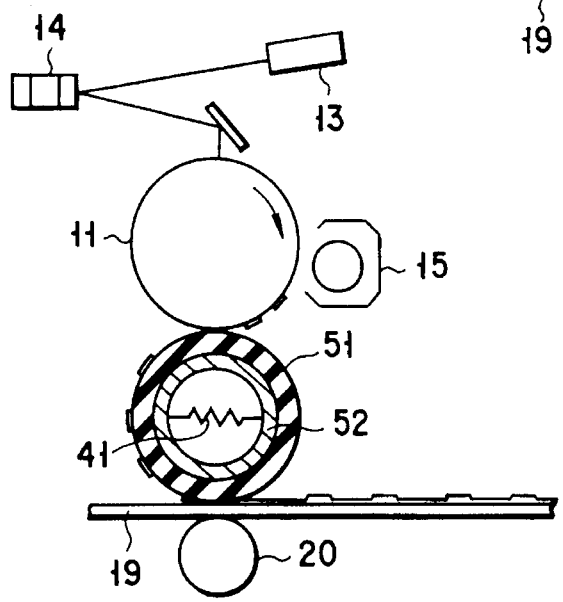
F I G. 11
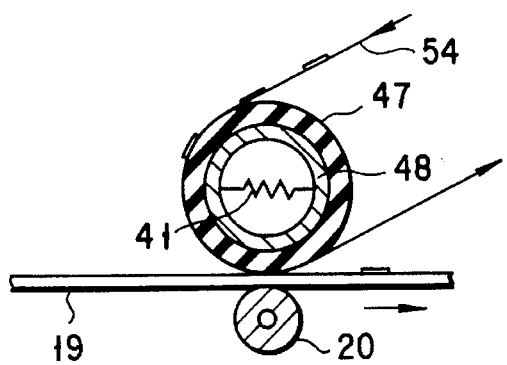
F I G. 12

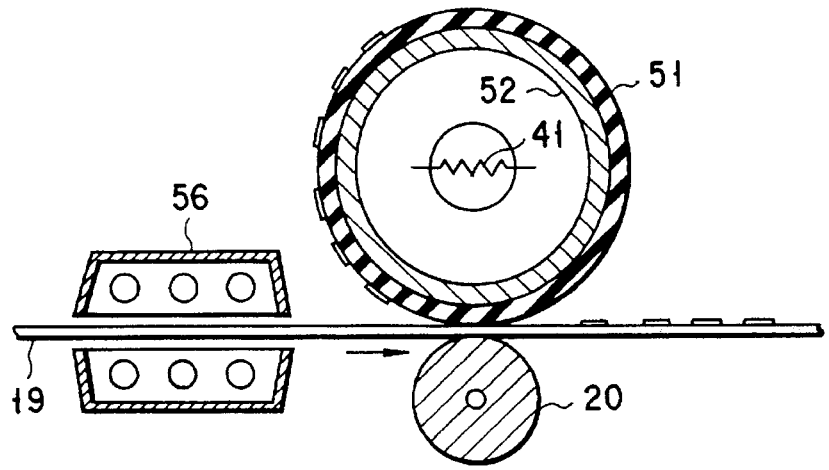
F I G. 13
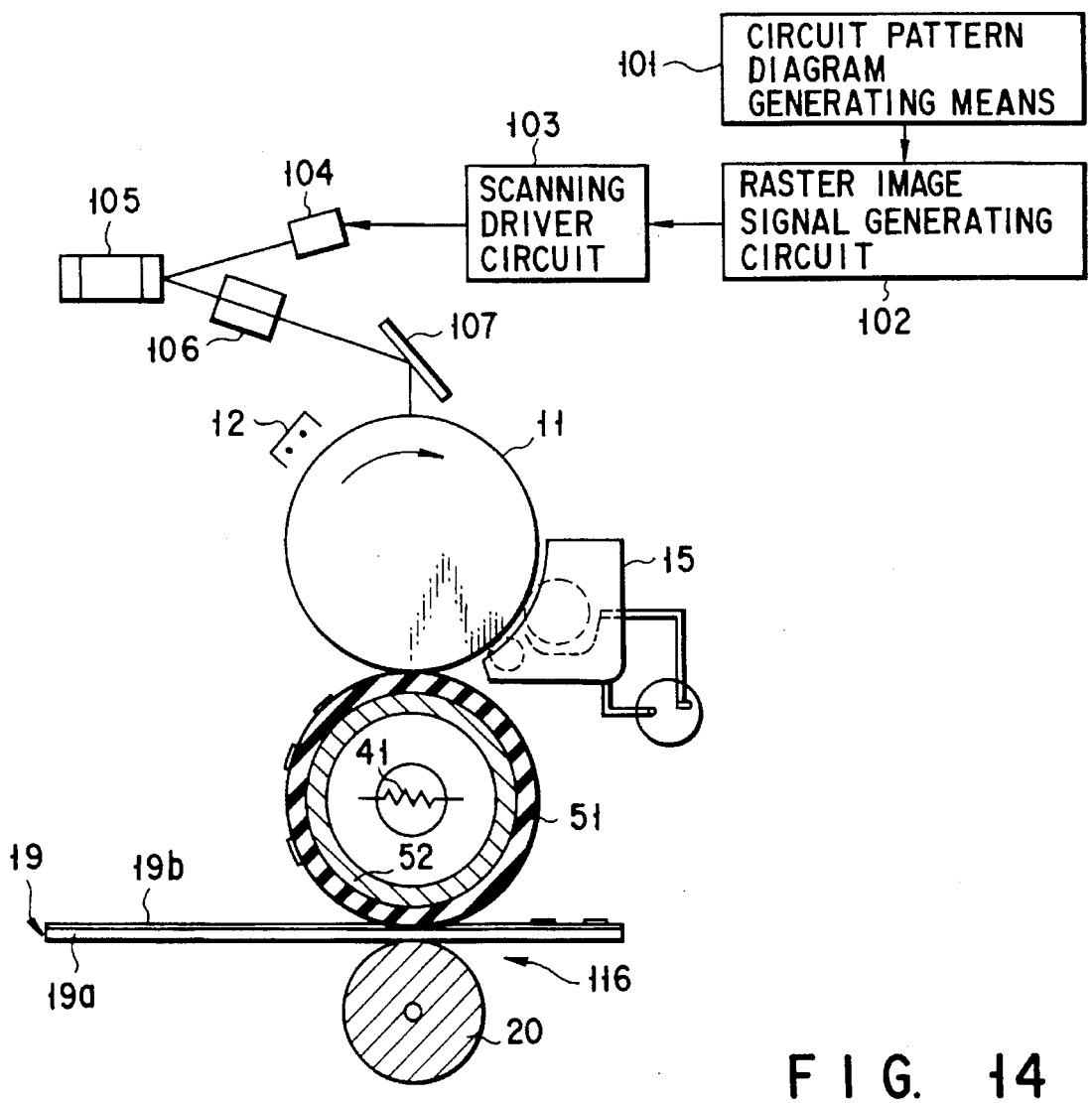
F I G. 14

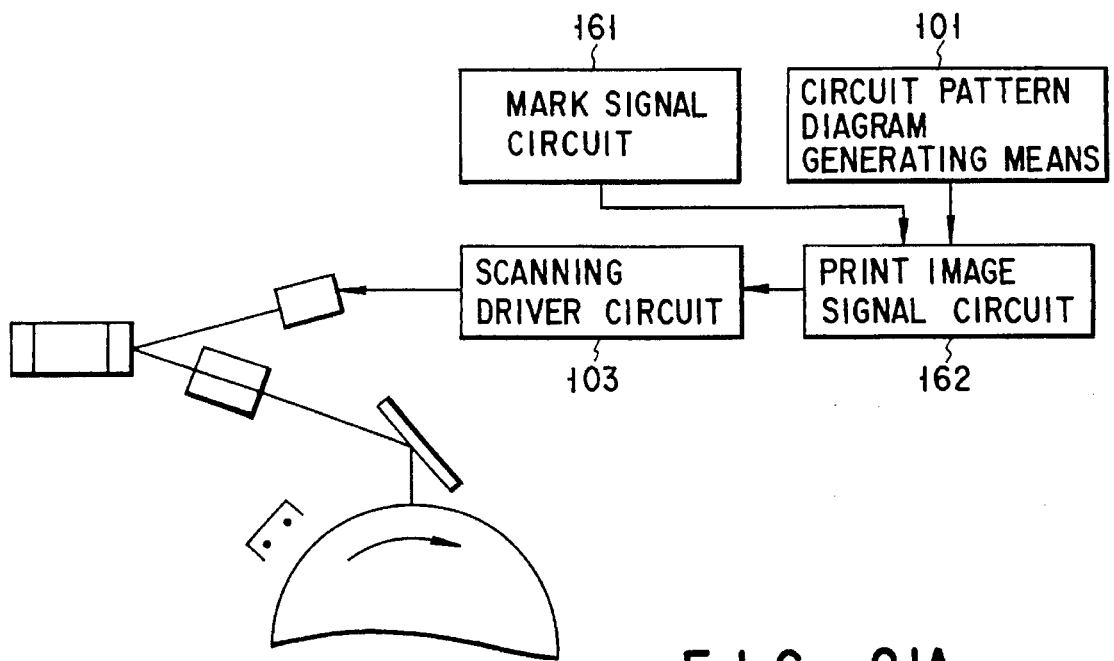
F I G. 21A
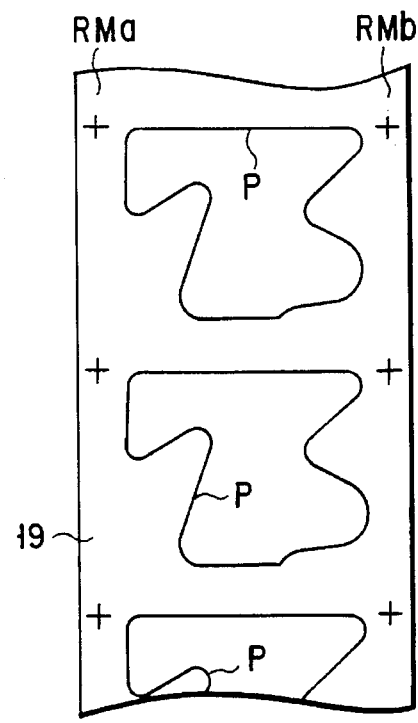
F I G. 21B

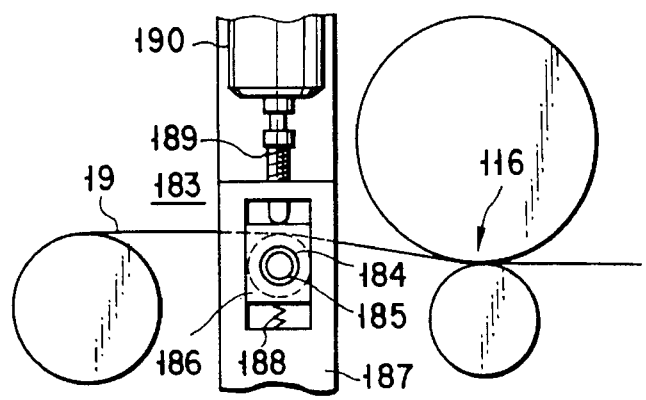
F I G. 24
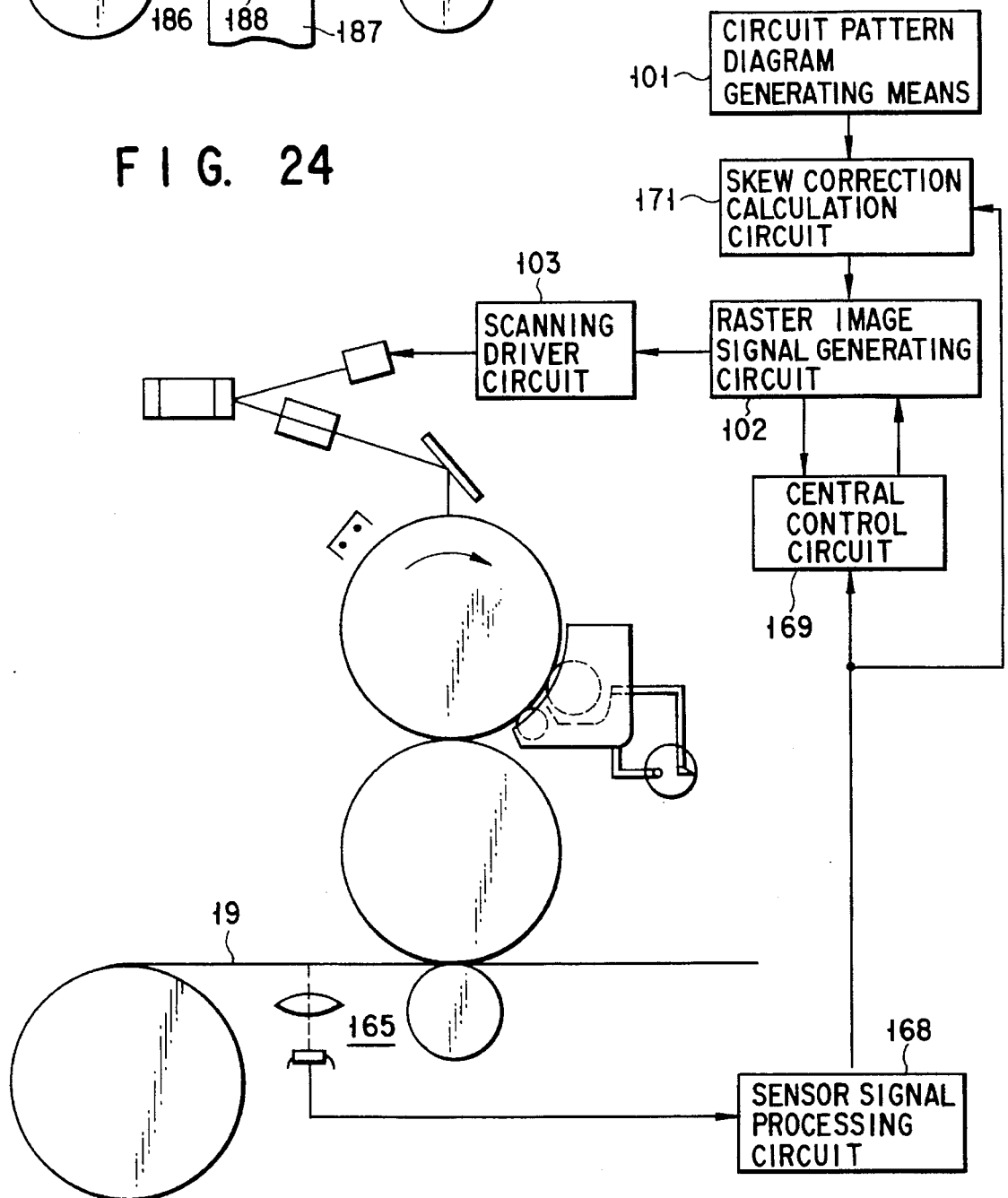
F I G. 25

PROCESSING METHOD BASED ON RESIST PATTERN FORMATION, AND RESIST PATTERN FORMING APPARATUS

BACKGROUND OF THE INVENTION

1. Field of the Invention

The present invention relates to a processing method based on resist pattern formation and having a step of forming a pattern on the surface of a processing target member with a resist film, and a step of processing the processing target member based on the presence/absence of the pattern on the surface of the processing target member by causing a non-patterned portion to be changed by processing while protecting a patterned portion from being processed, and a resist pattern forming apparatus for forming the resist pattern.

2. Description of the Related Art

A processing method is known wherein a pattern is formed on the surface of a processing target member with a resist film, and processing is performed based on the presence/absence of the pattern on the surface of the processing target member by causing a non-patterned portion to be changed by processing while protecting a patterned portion from being processed.

As the application fields of this processing method, pattern etching, pattern plating, pattern vapor deposition, pattern electrolytic oxidization and the like are known and are widely practiced. In particular, etching is employed for processing a printed circuit board member and forming a hole or holes in a thin plate, and is thus regarded to be very important.

An example of this known etching method will be described below with reference to FIG. 26.

A base material, e.g., various types of metals, polyimide, or the like, which can be dissolved by an etchant is prepared. This base material is subjected to a cleaning step 201 for degreasing or the like, and is then subjected to a baking step 202 for removing water adsorbed in the base material.

Subsequently, a resist forming step 203 is performed. In this resist forming step, a liquid resist agent is coated on the base material, or a resist film formed in advance is bonded to the base material. In a pre-baking step 204, the solvent of the resist is removed by evaporation.

A pattern for etching is formed in a pattern designing step 205 by using a CAD (Computer Aided Design) or the like. The designed pattern is plotted in a plotting step 206 with a cutting plotter or a photoplotter, and is checked. At this stage, the pattern is plotted out with a larger magnification than the size of a pattern which is ordinarily processed. The plotted-out pattern is then photographed with a camera in a film photographing step 207. The photographed film is developed to form an exposure original. In an exposing step 208, the exposure original is placed on the surface of the pre-baked base material, and the base material is exposed to ultraviolet radiation through the original.

In the pattern of the exposure original, a portion that should remain after etching is transparent, and a portion that should be removed is black. When ultraviolet exposure is performed through this exposure original, a portion of the resist on the base material corresponding to the transparent portion of the pattern is polymerized and set with the ultraviolet rays. Accordingly, when the resist is polymerized and set with the ultraviolet rays, exposure is ended. After exposure, a developing step 209 for removing a non-set resist material is performed. The developing agent and a rinsing solution are evaporated in a post-baking step 210. The adhesion force of the set portion is increased by heat, thus ending resist pattern forming steps.

When the resist is patterned in this manner, the flow advances to an etching step 211. In the base material etching step 211, a solution that chemically dissolves a metal, e.g., ferric chloride, cupric chloride, or the like, is caused to act on the patterned surface, thereby removing the metal at a portion of the base material where the resist pattern does not exist. In the final resist removing step 212, the resist film which is no longer necessary is removed by peeling or oxidization, thus ending the entire process.

The units that are used in the resist pattern forming steps are a cleaning tank, a baking furnace, a resist coating machine or a resist bonding machine, an ultraviolet exposure unit, a resist developing unit, a CAD, a cutting plotter or a photoplotter, a large-sized camera, a set of film developing units, and a discharge water treating unit.

As the materials, a washing solution, a resist material, a cutting film, a photographic film, a set of photographic developing solutions, a discharge water treating agent, and the like are used.

The conventional etching method and apparatus described above have the following problems.

The conventional method requires a human resource having professional knowledge and skills for the operation. In processing, expensive materials are consumed for pattern formation. Moreover, a waste liquid and waste that may pollute the environment are produced, and an extra energy and water are consumed for processing. These problems must be solved.

The apparatus used in conventional resist pattern formation requires many types of expensive equipment for processing. Since the processing equipment occupies a large area, the facility investment is very large, and maintenance and management of the facilities require a high cost.

When a printed circuit board member is to be formed, in addition to formation of a conductive wire pattern, parts mounting is performed, parts names serving as the indices for later repairs, and patterns indicating parts mounting positions, parts postures, and the like are printed. For this purpose, a silk screen printing technique is employed. As is known, silk screen printing also requires formation of an original film, as in resist pattern formation, and includes complicated steps such as formation of an original plate, printing of the original plate with ultraviolet rays, and development. Character printing on the printed circuit board member is not finished until a printing step is performed by using a printing plate which is formed in this manner. Therefore, this printing process is more complicated and has more problems than conventional resist pattern formation, in addition to the various problems described above that accompany conventional resist pattern formation.

Furthermore, in formation of a printed circuit board member and the like, it takes time to form a film used for etching. If an error is found in the film when checking the formed film, a correct film must be formed, leading to a large loss in time and cost.

To form a large amount of flexible printed circuit board members, a resist pattern is printed on the board material unrolled from a rolled state in accordance with the silk screen printing technique, and the printed resist pattern is etched. Although this method is suitable for a mass production, it takes too much time for fabrication of an article sample on an experimental basis or the small-lot manufacture, leading to a high cost.

The conventional target of processing utilizing a resist pattern includes printed circuit board members. However, the conventional processing method has drawbacks as described above. In addition, the printed circuit board members are adapted in various types of equipment. A variety of requests are made for the manufacture of the printed circuit board members, ranging widely from a very small-quantity manufacture as in the manufacture on an experimental, trial basis, a small-quantity manufacture for application to a special exclusive equipment, to a large-quantity manufacture in a mass production for application to commercial products.

The conventional resist pattern forming apparatus for printed circuit board members has separate single-function units for different steps, as is apparent from the conventional processing method shown in FIG. 26. Manual operations are performed between the respective steps. Intermediate products exist, such as a circuit pattern film, an etching resist coating board material, and the like, and a preparation time and a storage space are required for formation of these intermediate products.

Therefore, the conventional resist pattern forming apparatus is not suitable at all for small-quantity pattern formation, e.g., quick manufacture of articles on the experimental basis in which pattern correction is often performed. When the small-quantity manufacture is performed intermittently, the original film must be stored. Since a frequent manufacture leads to a high cost, a large amount of printed circuit board members must be stored.

SUMMARY OF THE INVENTION

It is, therefore, an object of the present invention to provide easy resist pattern formation which can be done with inexpensive materials without polluting the environment, is economical in terms of facilities and manufacturing cost, requires a very short preparation period, and can be applied very effectively for small-quantity processing with a variety of patterns, and processing method and apparatus based on resist pattern formation.

In order to solve the above problems, according to claim 1 of the present invention, there is provided a processing method based on resist pattern formation, comprising the steps of: forming an electrostatic latent image on an recording medium; developing the electrostatic latent image with a hot-melt toner, thereby forming a toner image on the recording medium; transferring the toner image from the recording medium to a processing target member in accordance with hot-melt transfer; and processing the processing target member based on the toner image on it as a resist pattern.

According to this method, a resist pattern is formed on the surface of the processing target member directly from a pattern original image signal without requiring a product for intermediate processing or handling such an intermediate product manually, and the surface of the processing target member can be subjected to various types of processing operations based on the pattern.

Therefore, according to the processing method of claim 1 of the present invention, the operation can be performed without requiring professional knowledge or skills, consumption of expensive materials for an intermediate product is eliminated, a preparation period is remarkably shortened, and a waste liquid and waste that can pollute the environment can be prevented from being produced. Furthermore, expensive large facilities necessary for an intermediate product are unnecessary, and thus cost for maintenance and management of such facilities can be economized.

According to the processing method of claim 2 of the present invention, since the melting, adhesive toner image is adhesion-transferred onto the surface of the processing target member in accordance with hot-melt transfer, the toner image is efficiently transferred at high precision to provide good contact with the surface of the processing target member, so that a high-precision, high-adhesion pattern is formed on the surface of the processing target member. When the formed pattern is cooled and solidified, it has a high chemical resistance and a high resistance to physical actions.

Therefore, according to the above processing method, a processing target member made of various types of materials can be subjected to high-precision etching. Also, etching in which the operation can be performed without requiring professional knowledge or skills, consumption of expensive materials for an intermediate product is eliminated, a preparation period is remarkably shortened, and a waste liquid and waste that can pollute the environment can be prevented from being produced, can be realized.

According to the processing method of claim 3 of the present invention, after the etching step, a solvent or heat is caused to act on a resist pattern made of a hot-melt toner to soften or dissolve it. Thus, the resist pattern can be easily removed without damaging the processing target member.

Therefore, according to this processing method, the resist pattern can be easily removed to cope with an application which requires removal of the resist pattern after etching.

According to the processing method of claim 4 of the present invention, the resist pattern can be easily removed in a dry state.

According to the processing method of claim 5 of the present invention, an organic solvent which is caused to act after etching dissolves only the resist pattern.

Therefore, according to this processing method of the present invention, the resist pattern can be removed very easily without damaging the etched member after etching.

According to the processing method of claim 6 of the present invention, the resist pattern is softened in a heated solution, and is separated from the surface of the processing target member to suspend in the solution upon application of a small physical force.

Therefore, when the solution containing the suspended matter is circulated and recovered with a capturing means such as a mesh, the resist pattern material is removed from the solution. Thus, the resist pattern is efficiently and simply removed.

According to the plating method of claim 7 of the present invention, since the melt, adhesive toner image is adhesion-transferred onto a conductively treated surface in accordance with hot-melt transfer, the toner image is efficiently transferred at high precision to provide good contact with the conductively treated surface, so that a high-precision, high-adhesion pattern is formed on the conductively treated surface. The formed pattern has a corrosion resistant to a plating bath and high insulating properties.

Therefore, according to this processing method, etching in which a high-quality resist pattern suitable for plating can be obtained, pattern formation can be performed without requiring professional knowledge, consumption of expensive materials for an intermediate product is eliminated, a preparation period is shortened, and a waste liquid and waste that can pollute the environment can be prevented from being produced, can be realized.

According to the processing method of claim 8 of the present invention, after plating, a solvent or heat is caused to act on a resist pattern made of a hot-melt toner to dissolve or soften it. Thus, the resist pattern can be easily removed without damaging the metal deposited by plating.

Therefore, according to this processing method, the resist pattern can be easily removed to cope with an application which requires only the plated portion after etching.

According to the processing method of claim 9 of the present invention, when the plated metal portion is separated and heated, the resist pattern toner attaching to the metal portion is set in the molten state. Only the resist pattern toner can be removed by adhesion transfer merely by urging a cleaning member to the toner without damaging the metal portion.

Therefore, according to this processing method, the resist pattern can be easily removed in a dry state without damaging the plating product.

According to the processing method of claim 10 of the present invention, the resist pattern can be removed only by causing an organic solvent to act on the plating product.

Therefore, according to this processing method, the resist pattern can be removed very simply without damaging the plating product with an external force.

According to the processing method of claim 11 of the present invention, the resist pattern is softened in a heated solution. When a small physical force is applied to the softened resist pattern, the resist pattern easily separates from the plating product and suspends in the solution.

Therefore, when the solution containing the suspended matter is circulated and recovered with a capturing means such as a mesh, the resist pattern material is removed from the solution. Thus, the resist pattern is efficiently and simply removed.

In the processing method according to claim 12 of the present invention, a wet toner obtained by dispersing a hot-melt toner in a solution-dispersed medium is used for development. In development using a wet toner, the quantity of heat which is generated when the toner is conveyed to act on an electrostatic latent image for development is small, and the frictional force acting on the toner is also small. Thus, a toner having a low hot-melting temperature can be employed. As a result, a toner image can be hot-melt-transferred at a low temperature.

In a liquid dispersing medium, a toner having a very small particle size can be stably dispersed. Accordingly, a sharp, dense, high-definition, high-precision resist pattern image can be obtained by developing an electrostatic latent image.

Therefore, according to this processing method, the hot-melt transfer temperature and the like can be set low to simplify the process. Since a sharp, dense, high-definition, high-precision resist pattern can be obtained, the precision and density of processing based on resist pattern formation can be increased.

According to the processing method of claim 13 of the present invention, even if the processing target member is rigid, cannot be deformed easily, or has a slight uneven distortion, the flexible support body supporting the toner image, i.e., the recording medium, is elastically formed to conform to the surface shape of the processing target member, so that the toner image can be hot-melt-transferred onto the surface of the processing target member without any problems.

Therefore, according to this processing method, processing based on resist pattern formation can be performed on various types of processing target members, the surfaces of which are not completely flat and lack flexibility.

According to the processing method of claim 14 of the present invention, a high-precision, stable toner image is formed on the surface of a rigid member, is transferred once to a flexible intermediate transfer member, and is then hot-melt-transferred from the flexible intermediate transfer member onto the processing target member. Thus, a high-precision, stable toner image can be hot-melt-transferred even onto a processing target member which lacks flexibility, thereby forming a resist pattern.

Therefore, according to this processing method, the precision, definition, and uniformity of the resist pattern can be improved, so that the quality of the processing method based on resist pattern formation can be improved.

According to the processing method of claim 15 of the present invention, even if a processing target member subjected to toner image hot-melt transfer has a large heat capacity, the toner image is prevented from being solidified instantaneously when the surface of the toner image is brought into contact with the processing target member during toner image transfer. The toner image in the molten state is brought into contact with the processing target member, so that a good wet state between the molten toner and the processing target member is realized. Toner image transfer and adhesion properties of the transferred toner image are improved, thus enabling high-quality resist pattern formation.

Therefore, according to this processing method, the processing method of the present invention based on resist pattern formation can be applied to a thick member having a large heat capacity and a processing target member which has a high thermal conductivity and thus cannot be easily heated.

Furthermore, in order to solve various problems arising in etching resist pattern formation for the purpose of processing a printed circuit board member, the following apparatus is provided according to the present invention.

More specifically, according to claim 16 of the present invention, there is provided an etching resist pattern forming apparatus comprising: means for generating a printed circuit pattern signal; a recording medium; means for forming an electrostatic latent image on the recording medium in accordance with the pattern signal; means for developing the electrostatic latent image with a hot-melt toner, thereby forming a toner image; means for supporting and conveying the toner image to a transfer station; means for overheating the toner image on the conveying means to hot-melt transfer, at a transfer station, the toner image onto a metal foil of a printed circuit board member obtained by laminating an insulating support plate and a metal foil; and means for conveying the printed circuit board member to the transfer station.

According to this etching resist pattern forming apparatus of the present invention, when a printed circuit pattern signal is sent, an electrostatic latent image based on the pattern signal is automatically formed on the electrostatic latent image forming medium in the apparatus, and is developed with the hot-melt toner, thereby forming a resist pattern image on the toner image carrier medium (recording medium or conveying means).

The toner image on the carrier medium is hot-melt-transferred onto the surface of a metal foil of a supplied printed circuit board member, i.e., a printed circuit board member obtained by laminating an insulating support plate and a metal foil layer, in the same or separate apparatus.

Therefore, when this apparatus of the present invention is employed, no manual operation need be especially performed except for forming a resist pattern signal, no intermediate re-usable product, e.g., a pattern film, is formed, and no expensive materials, chemical solutions, washing water, or the like is used. The apparatus can be made compact. Thus, various problems occurring in the conventional etching resist pattern forming methods and apparatuses can be solved.

According to the etching resist pattern forming apparatus of claim 17 of the present invention, the sharp edge of the thick printed circuit board member is prevented from damaging the toner image carrier medium, or the edge portion is prevented from entering the nip portion or transfer station to generate noise or vibration, so that disturbance will not occur in electrostatic latent image formation or toner development.

Therefore, according to this apparatus, an etching resist pattern can be formed even on the surface of a printed circuit board member having a sharp cutting end face or of a printed circuit board member having a large thickness without any problem.

According to the etching resist pattern forming apparatus of claim 18 of the present invention, control can be performed such that pressure contact is performed by measuring a time or moving amount from the time when a printed circuit board member is detected to the time when the edge portion of the detected printed circuit board member passes the pressure contact means.

Therefore, according to this apparatus, separation and pressure contact of the pressure contact means can be reliably controlled with a simple arrangement, thereby reliably preventing damage to the toner image carrier medium.

According to the etching resist pattern forming apparatus of claim 19 of the present invention, write start of the image signal of the resist pattern and supply of the printed circuit board are started without accurate synchronization, and convey of the printed circuit board is stopped once at the upstream portion of the transfer station, and resumed at a timing synchronized with movement of the resist pattern toner image, thereby registering the resist pattern toner image.

Therefore, according to this apparatus, since the electrostatic latent image write timing and the printed circuit board feed timing need not be synchronized, the apparatus is simplified. Since registration is performed near the transfer station in synchronism with movement of the toner image, high-precision position registration can be performed.

According to the etching resist pattern forming apparatus of claim 20 of the present invention, convey of the printed circuit board member is temporarily stopped when the leading end of the printed circuit board member passes the transfer unit, and is resumed when the resist pattern toner image approaches this position. Therefore, accurate position registration can be performed.

Therefore, according to this aspect, an etching resist pattern forming apparatus in which damage to the toner image carrier medium is prevented and which has a high registration precision can be realized with a simple arrangement.

According to the etching resist pattern forming apparatus of claim 21 of the present invention, damage to the surface of the toner image carrier medium caused by the two end edges of the printed circuit board member in the widthwise direction can be prevented by the protection films present between the toner image carrier medium and the printed circuit board member. As these protection films are moved at the same velocity as that of the printed circuit board member and the toner image carrier medium, they will not interfere with convey of the printed circuit board member and the toner image carrier medium. As the protection films are thin films arranged only to correspond to the edge portions of the printed circuit board member, they will not interfere with hot-melt transfer of the toner image.

Therefore, with the arrangement of this apparatus, an etching resist pattern forming apparatus having a long-life toner image carrier medium can be realized.

According to the etching resist pattern forming apparatus of claim 22 of the present invention, even if the leading and trailing edges and the two widthwise edges of the printed circuit board member damage the toner image carrier medium, the intermediate transfer belt serving as a disposable toner image carrier medium is discarded after it is used once or several times before an adverse influence of the damage occurs. Therefore, no problem occurs.

Therefore, with this arrangement, a complicated apparatus arrangement aiming at prevention of damage caused by the edge of the printed circuit board member becomes unnecessary, and thus a simplified, high-reliability etching resist pattern forming apparatus can be realized.

According to the etching resist pattern forming apparatus of claim 23 of the present invention, an etching resist pattern and a toner image of the registration mark can be transferred onto the surface of a printed circuit board member with a registration mark pattern signal synthesized with a printed circuit diagram pattern signal, and registration in the additional processing steps can be performed with reference to the registration mark.

Therefore, with the above arrangement, a printed circuit board etching resist pattern forming apparatus, which can print a registration mark used for accurate registration in the additional processing steps can be realized.

According to the etching resist pattern forming apparatus of claim 24 of the present invention, a registration mark, which has been formed on one surface of a printed circuit board member simultaneously when forming an etching resist pattern on the same surface, is read, and another etching resist pattern is formed on the other surface to be registered with the first pattern on one surface. In this case, the registration mark is registered with the resist pattern on one surface at high precision. Therefore, the etching resist pattern which is to be formed on the other surface to be registered with this registration mark can be registered with the resist pattern, which has already been formed on one surface, at high precision.

Therefore, with the apparatus having the above arrangement, a high-precision resist pattern forming apparatus for a printed circuit board member can be realized.

According to the etching resist pattern forming apparatus of claim 25 of the present invention, after an etching resist pattern is formed on one surface of the printed circuit board member, assume that another etching resist pattern is to be formed on the other surface of the printed circuit board member to be registered with the first etching resist pattern formed on one surface. In this case, the roll position of the printed circuit board member, which has been wound in the roll manner and has one surface having the etching resist pattern or a circuit pattern thereon, is moved when a displacement occurs in the skew direction with respect to the scanning direction of the print head, so that the skew is corrected and registration can be performed.

Therefore, with this arrangement, a resist pattern forming apparatus for a two-sided printed circuit board member, which has a high-precision registration mechanism including that for skew correction, can be realized.

According to the etching resist pattern forming apparatus of claim 26 of the present invention, a guide means, one end portion of which is movable in a direction intersecting the feed direction of the printed circuit board member, is provided. After an etching resist pattern is formed on one surface of the printed circuit board member, and then another etching resist pattern is to be formed on the other surface of the printed circuit board member to be registered with the first etching resist pattern on one surface, the guide means is inclinedly moved to differ the length of the convey path of the printed circuit board member on the right side from that on the left side. Therefore, the skew can be corrected while the holding position of the rolled printed circuit board member is fixed.

Therefore, in this apparatus, the skew correcting mechanism of the printed circuit board etching resist pattern forming apparatus can be simplified.

Also, a skew correcting means, that can continuously perform etching resist pattern formation on one and the other surfaces of the printed circuit board member with a series of units without taking up the printed circuit board member in the roll manner, can be provided by connecting two etching resist pattern forming apparatuses in series.

According to the etching resist pattern forming apparatus of claim 27 of the present invention, after an etching resist pattern is formed on one surface of the printed circuit board member, and then another etching resist pattern is to be formed on the other surface to register with the first etching resist pattern, a registration mark is formed on one surface together with the first etching resist pattern. This registration mark is detected before forming another etching resist pattern on the other surface to obtain a difference between the scanning position of a print head used for forming the resist pattern on the other surface and the coordinate position of the pattern which is already formed on one surface. Coordinate conversion of the printed circuit pattern diagram is performed to eliminate this difference. Thus, the pattern diagrams on the two surfaces can be registered without using any mechanical adjusting means.

With the etching resist pattern diagram generating apparatus described above, resist patterns for a two-sided printed circuit board member can be formed at high precision with an apparatus having a simplified mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B are views for explaining a processing method based on resist pattern formation according to the first embodiment of the present invention, in which FIG. 1A is a flow chart, and FIG. 1B includes schematic views for explaining first to third steps.

FIGS. 2A to 2C are sectional views for explaining the fourth step of the above method, in which FIG. 2A is a partial enlarged view of a processing target member on which a pattern is formed, FIG. 2B is a view showing a state wherein the processing target member, on which an etching resist pattern is formed, is dipped in an etchant, and FIG. 2C is a partial enlarged view of the etched processing target member.

FIGS. 3A to 3C are views for explaining a processing method based on resist pattern formation according to the second embodiment of the present invention, in which FIG. 3A is a flow chart, FIG. 3B is a schematic view for explaining the third step, and FIG. 3C is a view showing a processing target member from which a resist pattern is removed.

FIGS. 6A to 6E are views for explaining a processing method based on resist pattern formation according to the third embodiment of the present invention, in which FIG. 6A is a flow chart, FIG. 6B is a sectional view showing a processing target material on which a pattern is formed, FIG. 6C is a sectional view for explaining the step of forming a separation film on the processing target material, FIG. 6D is a sectional view for explaining the step of plating the processing target member, and FIG. 6E is a sectional view showing the processing target member on which a plating material is formed on a non-patterned portion.

FIGS. 7A to 7C are views for explaining a processing method based on resist pattern formation according to the fourth embodiment of the present invention, in which FIG. 7A is a flow chart, FIG. 7B is a sectional view for explaining an eighth step of dipping, in an organic solvent, a plating product separated from a processing target member and on which a resist pattern is attached, and FIG. 7C is a sectional view showing an obtained plating product.

FIGS. 8A and 8B are views for explaining a method of removing resist patterns from plating portions, in which FIG. 8A is a sectional view showing a state wherein a plating material is separated from a processing target member, and FIG. 8B is a sectional view showing a state wherein a plating product is sent into a gap between a heat roller and a press roller and a resist is thermally melted, adhered, transferred, and removed.

FIG. 9 is a sectional view for explaining a modification of a developing step of the fourth embodiment of the present invention.

FIG. 10 is a sectional view for explaining a modification of the first to third steps of the fourth embodiment of the present invention.

FIG. 11 is a sectional view for explaining another modification of the first to third steps of the fourth embodiment of the present invention.

FIG. 12 is a sectional view for explaining a modification of the third step of the fourth embodiment of the present invention.

FIG. 13 is a sectional view for explaining another modification of the third step of the fourth embodiment of the present invention.

FIG. 14 is a view which is partially in section for explaining a resist pattern forming apparatus according to the fifth embodiment of the present invention.

FIGS. 15A and 15B are elevational views for explaining a pressure contact transfer means control unit which can be used in the apparatus of the present invention to separate a toner image carrier medium from a printed circuit board member, in which FIG. 15A shows a state wherein the solenoid is ON, and FIG. 15B shows a state wherein the solenoid is OFF.

FIGS. 17A and 17B are views for explaining an apparatus for forming a resist pattern on the printed circuit board member according to the seventh embodiment that can be controlled precisely, in which FIG. 17A is a view schematically showing the entire apparatus, and FIG. 17B is a timing chart for explaining an operation control of this apparatus.

FIGS. 18A and 18B are views for explaining an apparatus according to the eighth embodiment that can precisely control the position of a resist pattern formed on a printed circuit board member, in which FIG. 18A is a view schematically showing the entire apparatus, and FIG. 18B is a timing chart for explaining an operation control of this apparatus.

FIGS. 19A and 19B are views for explaining a printed circuit board etching resist pattern forming apparatus according to the ninth embodiment that can prevent damage to a toner image carrier medium, in which FIG. 19A is a view schematically showing the entire apparatus, and FIG. 19B is a side view of part of this apparatus seen from a direction indicated by an arrow in FIG. 19A.

FIGS. 21A and 21B are views for explaining an apparatus according to the 11th embodiment to which a means for increasing precision of registration of a processing operation in post-processing is added, in which FIG. 21A is a view schematically showing part of the apparatus, and FIG. 21B is a plan view showing a printed circuit board member on which wiring patterns and registration marks are formed.

FIG. 24 is an elevational view for explaining an apparatus according to the fourteenth embodiment that enables correction of registration of etching resist patterns on the two surfaces.

FIG. 25 is a schematic view for explaining an apparatus according to the fifteenth embodiment in which registration of the patterns on the two surfaces including skew correction is electrically corrected.

DETAILED DESCRIPTION OF THE PREFERRED EMBODIMENTS

Figure 3A:
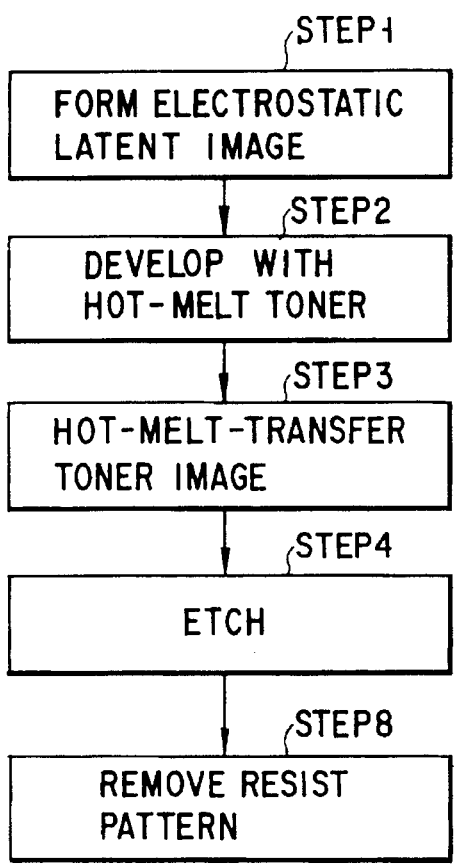

The first embodiment of the present invention will be described with reference to FIG. 1A to 2C.

FIG. 1A shows a flow chart of the processing method and comprises four steps to be described as follows. More specifically, step 1 is the step of forming an electrostatic latent image pattern on an electrostatic latent image forming medium. Step 2 is the developing step of causing a developing agent employing a hot-melt toner, to act on an electrostatic latent image formed in step 1, thereby forming a toner image. Step 3 is the toner image hot-melt transfer step of heating the toner image formed in step 2 into a hot-molten state and transferring the toner image onto a processing target member by hot melting. Step 4 is the processing step based on a resist pattern, in which a processing target member surface is processed by using the pattern comprising the hot-melt-transferred toner image as a resist pattern such that a patterned surface portion is prevented from being processed by the resist pattern while a non-patterned portion is processed.

Steps 1 to 4 will be described with reference to FIG. 1B and FIGS. 2A to 2C.

FIG. 1B (I) shows an example of the electrostatic latent image forming step. Referring to FIG. 1B (I), reference numeral 11 denotes a rotatable electrophotographic photosensitive drum 11. The circumferential surface of the electrophotographic photosensitive drum 11 is entirely uniformly charged by a corona charging unit 12. The charged surface is scanned with light from a light source 13, e.g., a semiconductor laser, which can be modulated in accordance with a pattern signal, by using a polygon mirror 14, thereby forming an electrostatic latent image pattern by exposure. As the scanning exposure means, other than the laser light scanning means described above, various types of optical write heads used in an electrophotographic printer may be used, e.g., one that uses a light-emitting diode array, one that controls transmission of light from a light source with a liquid crystal shutter array, and the like. As the original, one obtained by printing out or drawing the pattern can be used, and an exposure optical system that optically projects light onto the surface of the photosensitive drum to scan it can be employed.

To form an electrostatic latent image pattern, an electrostatic recording medium having a dielectric recording layer on its surface may be used, and an electrostatic latent image may be written by using an ion flow recording head which is controlled by a pattern signal. Such an ion flow recording head is known in, e.g., U.S. Pat. No. 4,365,549.

As shown in FIG. 1B (II), a hot-melt toner is supplied from a developing unit 15 to the electrostatic latent image pattern on the surface of the photosensitive drum 11, thereby developing this image. The hot-melt toner is put into practical use in general dry toner copying machines and electrophotographic printers. For example, the hot-melt toner is a toner having a particle size of 7 to 15 microns and obtained by mixing and pulverizing a coloring agent, e.g., carbon, by using a styrene resin, an acrylic resin, or a copolymer of these resins as a binder.

This development is achieved by conveying a two-component developing agent comprising a toner and a carrier with a magnetic force of a magnetic development roller, bringing the developing agent into light contact with the electrostatic latent image surface as a magnetic brush, and causing toner particles, charged by triboelectric charging with the carrier, to attach to the electrostatic latent image with an electric absorbing force generated by the electrostatic latent image, thus forming a pattern.

The "toner" employed in the present invention need not always necessarily be colored, since it is not visually observed as an image, and thus can be transparent or can contain a white pigment. However, although the toner is used for processing, it is preferably colored so that the shape of the pattern can be judged by visual observation of the pattern and registration for processing and pattern checking can be performed. Accordingly, a colored toner used in electrophotographic copying machines and printers may be employed. Note that the toner used in the present invention includes one which is not colored.

As the developing means employing the hot-melt toner, in addition to one which uses a dry toner as described above, one which uses a developing solution obtained by dispersing a toner having a particle size of about 1 to 2 microns in a liquid dispersing medium can be used.

In a developing unit that uses a developing solution, for example, the developing solution is attached to the surface of a developing roller, so that the developing solution acts on the electrostatic latent image. As a practical example of a developing unit that uses a developing solution employing a hot-melt toner E-Print 1000 available from Indigo Co., Israel, is known.

As shown in FIG. 1B (III), the toner image is set in a hot-molten state and brought into pressure contact with a processing target material 19, thereby transferring the pattern by hot-melt transfer. In FIG. 1B (III), a toner image is temporarily transferred to an intermediate transfer belt 16. The endless belt 16 is heated by a heat roller 18, thereby melting the toner to a molten state. The processing target material 19 is pressed between the heat roller 18 and a press roller 20, so that a pattern 21 is hot-melt-transferred to the surface of the processing target material 19. In this manner, when the intermediate transfer belt 16 is used, the toner can be hot-melted easily. A transfer corona charging unit 17 is used to transfer the toner image from the developing roller 11 to the intermediate transfer belt 16.

FIG. 2A shows a partial enlarged view of the processing target material 19 on which the pattern 21 is formed in the above manner. When the processing method of the present invention is applied to etching of a printed circuit board, the processing target material 19 is constituted by an insulating support body 19a and a copper foil or foils 19b laminated on the surface of the insulating support body 19a. An etching resist pattern 21 formed of a toner image is transferred to the surface of the copper foil 19b.

To form the electrostatic latent image on a belt-like medium, e.g., a belt-like photosensitive body or a belt-like electrostatic recording medium, intermediate transfer is not performed, and the electrostatic latent image can be directly transferred to the processing target member by heating the toner image. Also, an intermediate transfer roller may be used as an intermediate transfer medium. A toner image may be transferred from the photosensitive body while the intermediate transfer roller is heated, and this toner image may be hot-melt-transferred to the surface of the processing target member.

The processing target material 19 on which the pattern 21 is formed in the above manner is dipped in an etchant S containing, e.g., ferric chloride, cupric chloride, or the like, as shown in FIG. 2B. As a result, a portion of the copper foil on which the etching resist pattern does not exist is dissolved and removed, and a portion of the copper foil on which the etching resist pattern exists remains as the copper foil portion as the etchant does not act on it. FIG. 2C shows this state. As is seen from FIG. 2C, the copper foils 19b remain as a pattern having the same shape as that of the etching resist pattern, and copper foils are removed from other portions, thereby exposing the surface of the insulating support body 19a.

Processing based on the resist pattern can be applied to, e.g., a plating method called electroforming, other than etching described above.

According to the processing method based on resist pattern formation described above, a resist pattern can be formed through the simplified steps of forming an electrostatic latent image from a pattern original signal or directly from an original image, performing development with a hot-melt toner, and performing hot-melt transfer of the toner image. In addition, a resist pattern can be directly formed on a material, e.g., a metal or a plastic, which is to be processed based on the resist pattern.

Therefore, according to the processing method of the first embodiment, an exposure original which is conventionally needed need not be formed, and the steps of forming a resist film on a processing target member, performing exposure, and performing development are not needed.

As a result, materials and equipment for forming an exposure original film become unnecessary, so that generation of a waste liquid, e.g., washing water for washing the treating agent, that can pollute the environment can be prevented. Since materials and equipment accompanying resist film formation, ultraviolet exposure, and development become unnecessary, the problem of environmental pollution caused by washing water for washing the treating agent does not arise.

In the above method, since the resist pattern is formed on the surface of a processing target member instantaneously based on a resist pattern signal, the operation time and the preparation time can be greatly decreased when compared to a conventional method of forming an exposure original film.

In this method, the number of steps that need manual operations is extremely decreased, and the number of steps in which operations are performed by skilled operators and the like is very small.

The second embodiment of the present invention will be described with reference to FIGS. 3A to 3C.

In this embodiment and following other embodiments to be described later, members substantially the same as those of the first embodiment and members that are substantially common among the following embodiments will be denoted by the same reference numerals, and a detailed description thereof will be omitted.

Of the operation steps of the processing method shown in FIG. 3A, step 1 is the step of electrostatic latent image formation, step 2 is the development step using a hot-melt toner, step 3 is the hot-melt transfer step for the toner image, step 4 is the etching step belonging to the processing step based on a resist pattern, and step 8 is the resist pattern removing step.

In this processing method, steps 1 to 4 are identical to those of the first embodiment. In the second embodiment, only the step (step 8) of dissolving, or dissolving and removing, the resist pattern from the surface of the etched processing target member is added after the etching step (step 4) of the processing method of the first embodiment. This step 8 will be described with reference to FIGS. 3B and 3C.

In step 8, a pattern made of a toner image is removed from the etched surface of the processing target member without deforming or damaging the processing target member. Since the resist pattern is made of a material having a different nature from that of a conventional resist pattern, a method of removing the resist pattern is also different.

Figure 3B:
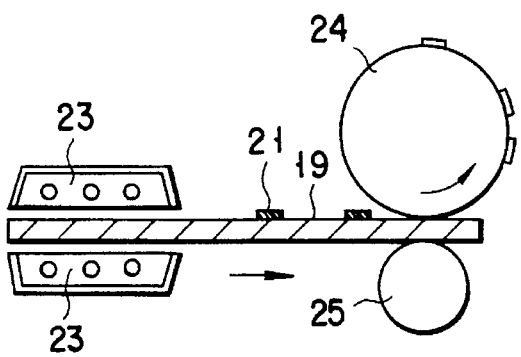
Figure 3C:
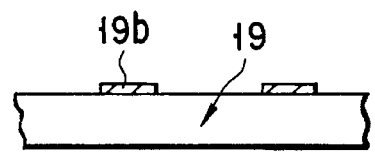

First, as shown in FIG. 3B, while a processing target material 19 on which a resist pattern 21 is formed is conveyed in a direction indicated by an arrow, the processing target material 19 and the resist pattern 21 are heated by heaters 23 provided above and below the processing target material 19, so that the resist pattern is melted. The processing target material 19 is conveyed farther forward and fed into a cleaning portion comprising a cleaning member 24 and a press roller 25. The molten resist pattern is removed as it is adhered to the rotating cleaning member 24. FIG. 3C shows the processing target material 19 from which the resist pattern is removed in this manner. Copper foils 19b corresponding to the resist pattern remain, and other copper foils are removed by etching.

The resist pattern removing method is not limited to that described above. Other dissolving or melting methods, e.g., a dissolving and removing method using an organic solvent, a method of softening the resist pattern in a solution by heating and removing the resist pattern with a physical force, and the like can be employed. Since any of these methods does not separate a solidified resist pattern with an external force, the resist pattern can be removed without damaging the processing target member.

It is preferable that a cleaning member to be abutted against the molten resist pattern has a porous or uneven surface so that it is brought into good contact with the toner material to be transferred, and maintains a temperature lower than at least the temperature of the resist pattern which is fed after being heated.

According to the etching method described with reference to FIGS. 3A to 3C, the resist pattern which is no longer necessary after etching can be safely removed from the processing target member without damaging the processing target member.

In removal of the resist pattern, a method of causing an organic solvent, which dissolves the resist pattern but does not dissolve the processing target member, to act on the resist pattern will be described with reference to FIG. 4.

In this example, as a toner used for pattern formation, one obtained by adding a coloring agent or the like to a hot-melt resin, e.g., polystyrene, polymethyl methacrylate, or the like serving as a major component is used.

Reference numeral 26 denotes an organic solvent that dissolves this resin but does not dissolve the member to be etched. When the member to be etched is a printed circuit board, the copper foil 19b forming the pattern is not dissolved in the organic solvent. The insulating support body of the processing target material 19 is usually made of, e.g., polyimide, epoxy glass, phenol, ceramics, or the like, and is not denatured by the organic solvent, e.g., benzene, toluene, methyl ethyl ketone, cyclohexane, and the like that dissolves polystyrene, polymethyl methacrylate, or the like.

Figure 4:
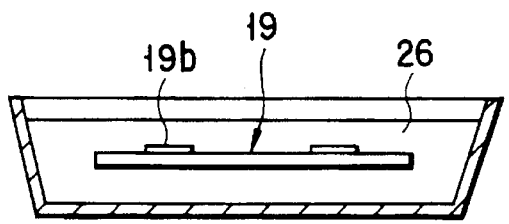
FIG. 4 is a sectional view for explaining a method of causing an organic solvent, which dissolves a resist pattern but does not dissolve a processing target member, to act on the processing target member.

When the processing target material 19 which has been subjected to the etching step (step 4) is dipped in the organic solvent 26 as shown in FIG. 4, the etching resist pattern made of a toner image can be removed without applying an external force. The resist pattern can be similarly removed by pouring the solvent to the processing target material 19, as a matter of course. It is preferable to employ a plurality of steps, e.g., of sequentially dipping the processing target material 19 in toner-dissolving solutions filled in a plurality of trays and rinsing the processing target material 19 with a fresh agent after the toner is dissolved. If the organic solvent is poured to the processing target material 19 like a shower to fluidize the solution, thereby promoting dissolution, the resist pattern can be effectively removed.

Therefore, the resist pattern can be removed without damaging the processing target member.

In the resist pattern removing step, a method of softening the resist pattern on the processing target member in a solution heated to a temperature equal to or higher than the softening temperature of the resist pattern and applying a physical force, thereby removing the resist pattern, will be described with reference to FIG. 5.

Figure 5:
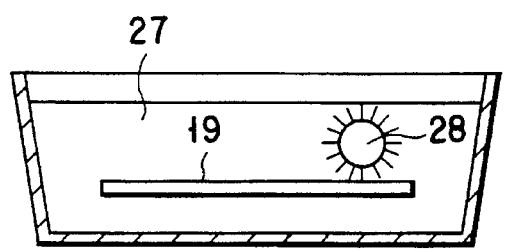
FIG. 5 is a sectional view for explaining a method of softening a toner in a heated toner and removing the toner from the processing target member.

Referring to FIG. 5, reference numeral 27 denotes a softening solution which is heated to a temperature equal to or higher than the softening temperature of the toner image. A rotary brush 28 is dipped in the softening solution 27 to apply a physical force to the softened resist pattern so that the softened resist pattern is separated from the surface of the processing target member.

When the toner is a dry hot-melt toner, its softening temperature is usually 100° C. or more and thus will not be softened unless it is heated to at least a temperature of hundred and several ten °C. Therefore, several types of oils having a high boiling point are used as the softening solution 27.

When a toner image is formed by using a liquid developing agent, the softening point of the toner can be decreased to 100° C. or less. Thus, water can be used as the softening agent. This is preferable since water can be completely removed by evaporation after the resist pattern is removed. In contrast to this, when an oil having a high boiling point is used, sometimes an additional step must be added to remove the oil by washing it with another washing solution.

In the resist pattern removing step shown in FIG. 5, the resist pattern material which is separated from the processing target material 19 into the softening solution 27 by rubbing the resist pattern with the rotary brush 28 can be captured by a removing means, e.g., by capturing it with a mesh while circulating the softening solution, so that the softening solution can be repeatedly used.

When the method of removing the etching resist pattern made by the toner image, which is described with reference to FIG. 5, is applied to the etching method based on etching resist pattern formation of the present invention, the etching resist pattern can be removed with a simple operation step without damaging the etched processing target member.

The third embodiment of the present invention will be described with reference to FIGS. 6A to 6E.

Figure 6B:
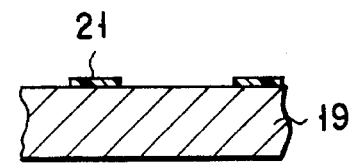
Figure 6C:
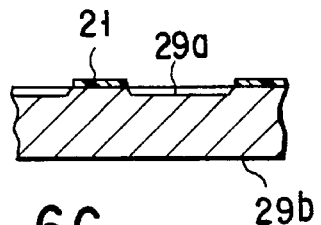
Figure 6A:
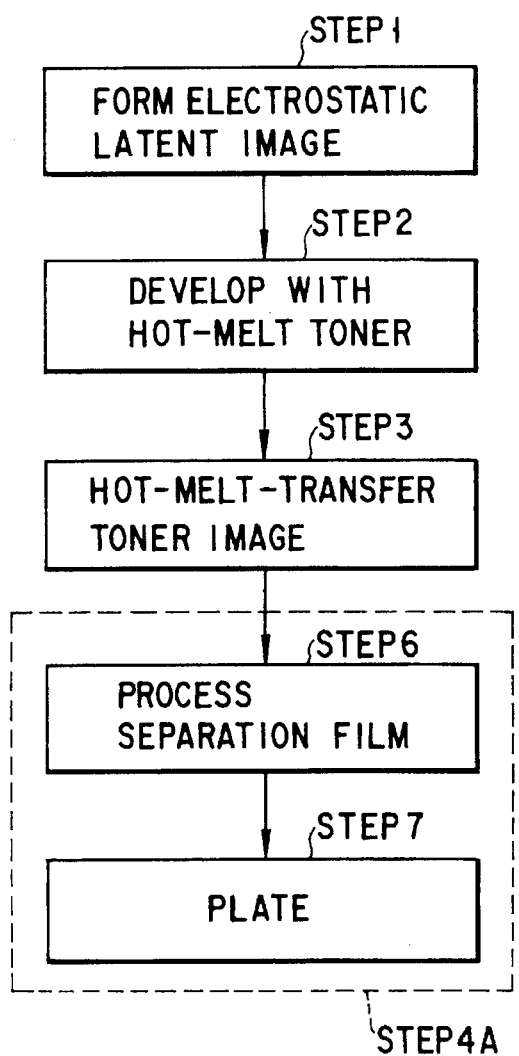

In the operation step of the processing method shown in FIG. 6A, step 1 is the step of forming an electrostatic latent image, step 2 is the developing step using a hot-melt toner, and step 3 is the step of hot-melt transfer step of the toner image.

In this processing method, steps 1 to 3 are identical to those of the first embodiment. Since the plating step (step 4A) is employed in this embodiment in place of the etching step (step 4), the plating step will be described with reference to FIGS. 6B to 6E.

The characteristic feature of this embodiment resides in that the processing target member is a member having a conductive surface and that after the resist pattern is formed, a plating solution is caused to act on the surface on which the resist pattern is formed, thereby depositing a metal on a portion where the resist pattern does not exist. As shown in FIG. 6A, this plating step has a separation film processing step (step 6), which is not always necessary as will be described later, and the plating step (step 7). More specifically, as shown in FIG. 6C, a processing target material 19 having a conductive surface on which a pattern 21 is formed in step 3, is subjected to the separation film processing step (step 6). This processing aims at forming a film that enables easy separation of a metal film, which is deposited by plating to have a pattern, from the board material. In the subsequent plating step (step 7), the processing target member on which the resist pattern is formed is placed in a plating bath and connected to a cathode. A voltage is applied to the processing target member by using the other electrode metal as the anode. Thus, metal is deposited on a portion having no resist pattern so as not to deposit a metal on the electrically insulating resist pattern portion. In this manner, patterned metal processing can be performed.

In this embodiment, an electrically insulating toner is used as the hot-melt toner. Usually, an insulating toner is used in development based on a development principle other than that utilizing the conductivity of a specific toner, e.g., a one-component magnetic toner. Thus, the insulating toner can be employed in this embodiment.

As the processing target member, a nickel-plated copper plate, an iron plate, a nickel plate, a stainless steel plate, or the like is used.

When the processing method of this embodiment is adopted in a processing method called electroforming that separates and extracts only a metal deposited by plating, the separation film processing step (step 6) must be added. With this step, a separation film 29a is formed, as shown in FIG. 6C, so that a metal portion deposited by plating can be separated from the surface of the processing target member while maintaining at least the conductivity of a surface portion of the processing target member on which the metal is deposited by plating.

For this purpose, a film of an oxide, a chromate, a sulfide, or the like is formed. To form an oxide film, anodization is performed for a short period of time in a degreasing electrolyte or a caustic soda solution. To form a chromate or sulfide film, the processing target member is dipped in a sodium chromate solution or a sodium sulfide solution for a short period of time. At this time, an insulating processing layer 29b is formed in advance on a lower surface or the like of the processing target member where a resist pattern is not formed. The insulating processing layer 29b can be formed by adhering an electric insulating tape or coating varnish or lacquer on this surface.

Figure 6D:
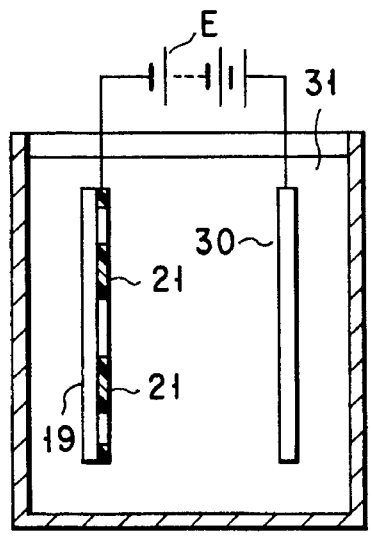

As shown in FIG. 6D, a processing target material 19 on which a resist pattern 21 is formed is connected to the cathode of a DC power supply E, and a plating metal 30 is connected to the anode. Both the processing target material 19 and the plating metal 30 are suspended in a plating bath 31, and the DC power supply E is energized, thereby plating the processing target material 19.

Figure 6E:
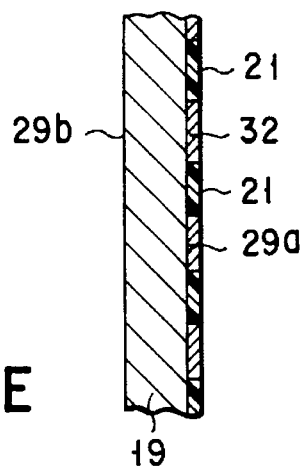

As the plating path, a copper pyrophosphate bath, a copper sulfate bath, or the like is employed for plating copper, and a Watt bath, a nickel sulfamate path, or the like is employed for plating nickel. In this manner, a plating portion 32 is formed on a surface of the processing target material 19 where the resist pattern 21 is not formed, as shown in FIG. 6E. Formation of the separation film 29a is necessary if the plating portion and the processing target member are to be finally separated from each other. To fix the plating portion on the processing target member, the step of separation film formation is not needed, and no separation film 29a is formed.

According to the plating method based on resist pattern formation described with reference to FIGS. 6A to 6E, a plating resist pattern can be formed by the simplified steps of forming an electrostatic latent image directly from a pattern original signal or from an original image, developing the image with the hot-melt toner, and hot-melt-transferring the toner image.

Therefore, according to the plating method of this embodiment, an exposure original film, which is conventionally necessary, need not be formed, and the steps of forming a resist film on the processing target member, performing exposure, and performing development are not required.

As a result, materials and equipment for forming an exposure original film become unnecessary, so that production of a waste liquid, e.g., washing water for washing the processing solution, that can pollute the environment can be prevented. Since materials and equipment necessary for the steps of resist film formation, ultraviolet exposure, development, and the like become unnecessary, the problem of environmental pollution caused by washing water for washing the treating agent does not arise.

In the processing method of this embodiment, since the resist pattern image can be formed on the surface of the processing target member instantaneously based on a pattern original signal, the operation time and the preparation time can be greatly decreased when compared to a conventional method of forming an exposure original film and exposing and printing the resist pattern by using the exposure original film.

Also, the number of steps that need manual operations is extremely decreased, and the number of operation steps in which operations must be performed by skilled operators is also decreased.

Of plating methods, one which is used for forming a through hole board member or a contact terminal portion in a printed circuit board material does not separate a plating portion from the board material. Thus, the separation film processing step (step 6) of FIG. 6A is unnecessary.

As a plating method which obtains a plating product by separating only a plating portion from a processing target member serving as the support body for processing, electroforming is known. When, however, electroforming is adopted in this embodiment, part of the resist pattern can undesirably attach to an edge and the like of the product obtained by separation.

A processing method according to the fourth embodiment, to which the step of removing the attached resist pattern is added, will be described below with reference to FIGS. 7A to 7C.

As is understood from the flow chart shown in FIG. 7A, steps 1 to 7 of this method are identical to the steps shown in FIG. 6A. Thus, only a resist pattern removal step (step 8) as the added step will be described below.

The characteristic feature of this embodiment resides in the dissolving or melt-removing step (step 8) which removes the resist pattern from the deposited metal portion without damaging the plating product after the plating portion as the metal deposited on a portion where the resist pattern does not exist is separated from the surface of the processing target member.

As shown in FIG. 7B, a plating product or a plating portion 32a, which is separated from the processing target member and to which a resist pattern 21 attaches, is dipped in an organic solvent 26. At this time, if the resist pattern has a large area, only its edge portion attaches to the plating product. However, if the resist pattern has a small dimension, e.g., is formed in a small hole of the plating product, the resist pattern is removed from the processing target member together with the plating product. As the organic solvent 26 which attaches to a plating product in this manner and dissolves and removes the resist pattern made of a toner image, benzene, toluene, methyl ethyl ketone, cyclohexane, or the like can be used.

When the resist pattern is dissolved and removed, only the plating portion 32a can be extracted singly, as shown in FIG. 7C.

In place of the above removing method, the resist pattern may be softened by heating, and be removed without applying a strong force to the plating product. With this method as well, the plating product will not be damaged. An example of this method will be described with reference to FIGS. 8A and 8B.

As shown in FIG. 8A, when a plating portion 32a is separated from a processing target material 19, part of a resist pattern 21 attaching to the plating portion 32a is also separated. The resist pattern 21 attaching to the plating portion 32a is fed into a portion between a heat roller 33, which is porous or has a fiber-like surface having a high affinity with a toner, and a press roller 34, as shown in FIG. 8B, so that the resist pattern 21 is removed by heat-melt transfer. At this time, when the feed speed of the plating portion 32a is set low, the resist pattern on the plating portion 32a is sandwiched in the nip portion between the two rollers 33 and 34 and melted. When the plating portion 32a is removed from the nip portion, the resist pattern is adhered and transferred to the heat roller 33, so that it can be removed from the plating product.

In the example described with reference to FIGS. 8A and 8B, the resist pattern can be easily removed without employing a wetting step or damaging the plating product.

As a method of removing the resist pattern, a method that causes an organic solvent, which dissolves the resist pattern but does not denature the metal, to act on the plating product, as described with reference to FIGS. 4 and 5, can also be employed to provide the same effect as described above.

A modification of step 2 as the development step of this embodiment will be described with reference to FIG. 9.

The characteristic feature of this modification resides in that the step of developing the electrostatic latent image performs development by using a wet developing agent obtained by dispersing a hot-melt toner in a liquid dispersing medium.

FIG. 9 shows the step of developing an electrostatic latent image of this processing method. A charge holding layer is formed on the surface of a drum 11 serving as an electrostatic latent image forming medium.

A developing unit 15 is of a wet type. A developing roller 38 and a squeeze roller 39 are rotatably provided in a tray 40. The tray 40 also stores a developing agent 37 and the like. The developing roller 38 is a metal roller. The developing roller 38 is rotated in a direction indicated by an arrow in FIG. 9 to convey the developing agent 37 attaching to its surface, so that the developing agent acts on the electrostatic latent image at a point where the roller 38 is closest to the electrophotographic photosensitive drum 11. The drum 11 is rotated in a direction indicated by an arrow in FIG. 9. After the drum 11 passes the developing portion, the developing agent attaching to the surface of the drum 11 is removed by the squeeze roller 39. The squeeze roller 39 is rotated in a direction indicated by an arrow in FIG. 9. Then, the developing agent attaching to the surface of the roller 39 is scraped off by a blade 39a, so that a surface of the roller 39 where the developing agent does not attach always acts on the drum 11.

As the developing agent 37, a known agent obtained by dispersing a hot-melt toner in a liquid dispersing medium, which is disclosed in, e.g., U.S. Pat. Nos. 4,794,651, 4,760,009, and the like can be used. Even a toner having a low melting point as a hot-melt toner, e.g., a toner having a melting point of 100° C. or less, can be dispersed in the known developing agent in a stable particle state. Thus, a heating temperature for hot-melt-transferring a developed toner image can be set low, thereby simplifying the transfer step.

Since the hot-melt toner is dispersed in a solution, the particle size of the toner can be small, i.e., several microns or less, so that a finely developed high-resolution image can be formed, thereby obtaining a high-quality resist pattern.

Another apparatus for practicing steps 1 to 3 will be described with reference to FIG. 10.

The characteristic feature of this apparatus resides in that, in order to form the above pattern as the resist pattern on the surface of a processing target member, a toner image is formed on the surface of a flexible support body, this surface is placed on the processing target member, and hot-melt transfer is performed while causing an elastic pressure contact force to act from the flexible support body side.

Referring to FIG. 10, reference numeral 42 denotes a flexible support body on which a toner image is to be formed. The support body 42 is obtained by, e.g., forming an electrophotographic photosensitive layer on a film, and forming the entire structure to have the shape of an endless belt; or forming a dielectric recording layer on a film, and forming the entire structure to have the shape of an endless belt. The support body 42 is looped between a roller 48 having an elastic surface layer 47 and a roller 48a paired with the roller 48. A portion of the support body 42 supported by the roller 48a forms an electrostatic latent image by the operation of a write head 43. The electrostatic latent image is developed by a developing unit 15, thus forming a toner image. Reference numeral 49 denotes a hot-melt transfer portion or a nip portion. The hot-melt transfer portion 49 is constituted by the roller 48 having the elastic surface layer 47, and a counter roller 20 that opposes the roller 48 through a processing target material 19. The roller 48 is a press roller having a heat source 41, e.g., an electric heater, in it. The roller 48 elastically urges and heats the processing target material 19 from the flexible toner image support body 42 side toward the counter roller 20. In FIG. 10, a toner image forming medium which is the same as the electrostatic latent image forming medium is used. More specifically, an electrostatic latent image is formed on the surface of a flexible support body and developed into a toner image. This toner image is hot-melt-transferred onto the surface of the processing target member.

According to the processing method using the apparatus having this arrangement, even if the processing target member is rigid and thus cannot be deformed easily, or has an uneven distortion and thus does not have a complete flat surface, the support body supporting the toner image is elastically formed in accordance with the surface shape of the processing target member, so that the toner image can be hot-melt-transferred onto the surface of the processing target member without any problems.

Therefore, according to this apparatus, processing based on a resist pattern can be performed on various types of processing target members, e.g., printed circuit board members and metal plates, the surfaces of which are not completely flat and which lack flexibility.

Still another apparatus for practicing steps 1 to 3 will be described with reference to FIG. 11.

The characteristic feature of this apparatus resides in that a toner image formed on a rigid surface is transferred to an intermediate transfer medium made of a flexible member, the flexible member as the intermediate transfer medium is placed on a processing target member, and the toner image is hot-melt-transferred while causing an elastic pressure contact force to act on the flexible member.

Referring to FIG. 11, reference numeral 52 denotes an intermediate transfer roller serving as the intermediate transfer roller. The intermediate transfer roller 52 has an elastic surface layer or rubber layer 51 which is in rotatable contact with a drum 11 serving as a toner image forming member having a rigid surface. The intermediate transfer roller 52 incorporates a heat source 41. The intermediate transfer roller 52 is disposed to oppose a counter roller 20 through a processing target material 19, so that the processing target material 19 passes through the pressure contact portion between the two rollers 52 and 20, thereby performing hot-melt transfer.

The drum 11 may be a photosensitive drum or a drum coated with a dielectric layer. An electrostatic latent image and a toner image are formed on the surface of the drum 11. It is easy to improve the finished state of the drum surface or to increase the mounting precision of the drum. Thus, high-definition latent image formation and high-quality development can be performed with an optical write head, an ion print head, or the like.

Generally, a toner image formed on a rigid surface like that of this apparatus cannot be directly hot-melt-transferred onto a processing target member lacking flexibility. However, according to the apparatus of this embodiment, a stable high-precision toner image is formed on the surface of a rigid member, transferred once to the flexible intermediate transfer member, and then hot-melt-transferred from the flexible intermediate transfer member onto the processing target member. Thus, a stable high-precision toner image can be transferred even onto a processing target member which lacks flexibility, thereby forming a resist pattern.

In FIG. 12, the intermediate transfer member is constituted by a flexible belt 54. After a toner image is transferred from a drum 11 onto the belt 54 with static electricity by causing a bias transfer roller and a corona charging unit to act on the rear surface of the belt 54, the belt 54 passes a heat roller 48 having an elastic surface layer 47 on it.

An apparatus and a method according to still another embodiment for practicing step 3 will be described with reference to FIG. 13.

The characteristic feature of these apparatus and method resides in that, in the toner image transfer step, both a toner image support body supporting a hot-melt toner image and a processing target member are heated, and the two members are brought into pressure contact at an elastic pressure contact force while the hot-melt toner is melted, thereby hot-melt-transferring the toner image onto the surface of the processing target member.

This apparatus is suitable when a thick member having a high heat capacity, e.g., a printed circuit board member and a metal plate, is used as a processing target material 19. Generally, when a processing target material 19 of this type is used, as the toner image in a hot-molten state is brought into contact with the processing target material 19 which is being conveyed in a direction indicated by an arrow in FIG. 13, the toner image is sometimes quickly cooled and is thus solidified. Then, an adhesion force is not generated between the processing target material 19 and the toner image, so hot-melt transfer is not correctly performed. For this reason, in this embodiment, in order to heat the processing target material 19, a heating means 56 comprising, e.g., an oven heater, is provided on the upstream side of the hot-melt transfer portion in the convey direction of the processing target material 19. An adhesion force acts before the toner in the hot-molten state is brought into contact with the processing target material 19 to be solidified.

According to this processing method, even if a processing target member has a large heat capacity, like a printed circuit board member or a metal plate, the hot-molten toner is prevented from being solidified instantaneously when it is brought into contact with the processing target member. The toner image in the molten state is brought into contact with the processing target member, so that a good wet state between the molten toner and the processing target member is realized. Toner image transfer and adhesion properties of the transferred toner image are improved, thus enabling high-quality resist pattern formation.

Therefore, according to the processing method of the embodiment shown in FIG. 13, the processing method of the present invention based on resist pattern formation can be applied to a thick processing target member having a large heat capacity and a processing target member which has a high thermal conductivity and thus cannot be easily heated.

An etching resist pattern forming apparatus for processing a printed circuit board member, to which the processing method of the present invention can be effectively applied, will be described as the fifth embodiment with reference to FIG. 14.

FIG. 14 shows this etching resist pattern forming apparatus comprising a means for generating a printed circuit pattern signal, a means for forming an electrostatic latent image on an electrostatic latent image forming medium in accordance with the pattern signal, a means for developing the electrostatic latent image with a hot-melt toner and causing the electrostatic latent image to be held by a toner image holding medium, a means for feeding a printed circuit board member, obtained by laminating an insulating support plate and a metal foil, to a transfer station, and a transfer station for heating a toner on the toner image holding medium, thereby hot-melt transferring the toner image onto the surface of the metal foil on the printed circuit board member.

Referring to FIG. 14, reference numeral 101 denotes a circuit pattern diagram generating means comprising a CAD system. Since a pattern diagram of this system is usually output in the form of a vector signal, it is converted into a raster signal by a raster picture signal generating circuit 102. Thus, the circuit pattern diagram generating means 101 and the raster picture signal generating circuit 102 constitute the means for generating the printed circuit pattern signal.

Referring to FIG. 14, reference numeral 103 denotes a scanning driver circuit for converting a pattern signal into data suitable for driving a scanner. An output signal from the scanning driver circuit 103 drives an optical write scanning unit comprising a laser light source 104, a scan mirror 105, an f-φ lens 106, and a mirror 107. Alternately, the optical write scanning unit may comprise an LED array print head, a liquid crystal shutter array, or the like.

The optical write scanning unit forms an electrostatic latent image pattern on the electrostatic latent image forming means constituted by an electrophotographic photosensitive drum 11 and a charging unit 12. The electrostatic latent image forming means is not limited to that of this embodiment but can be obtained by combining a drum having a dielectric recording layer, an ink flow print head, and the like.

This electrostatic latent image is developed by a developing unit 15 with a hot-melt toner employing a wet developing agent.

The developed toner image is transferred onto a toner image holding medium which is obtained by forming an elastic surface layer 51, e.g., rubber, on the outer circumferential surface of a rigid core 52 made of a metal tube and which incorporates a heater 41.

In this apparatus, the toner image developed on the electrophotographic photosensitive body is transferred once onto the toner image holding medium. The toner image is heated on the toner image holding medium by the heat of the heater 41 into the hot-molten state.

A processing target material 19 is a printed circuit board member which is obtained by laminating a metal foil, e.g., a copper foil 19b, on the surface of an insulating plate or sheet 19a. A hot-melt transfer station 116 is constituted by the toner image holding medium and a press roller 20. The printed circuit board member is fed into the pressure contact portion or nip portion between the two rollers, and the toner image developed into a circuit pattern is hot-melt-transferred onto the surface of the copper foil.

When a flexible board member obtained by adhering a copper foil on a polyimide sheet as a heat-resistant resin member, or a solid board member obtained by adhering a copper foil on an glass-reinforced epoxy plate or phenol resin plate is used as the circuit board member, the toner image can be transferred with good contact, since the surface of the toner image holding medium is coated with the elastic surface layer 51. In order to achieve transfer onto a solid board member without any problem in this manner, it is preferable that the elastic surface layer be formed as a thick layer having a thickness of 0.5 mm or more, and more preferably several mm or more, with a heat-resistant elastomer, e.g., silicone rubber.

According to the etching resist pattern forming apparatus for the printed circuit board shown in FIG. 14, when a printed circuit pattern signal is output, an electrostatic latent image is automatically formed on the electrostatic latent image forming medium in the apparatus based on the pattern, and developed with a hot-melt toner, thereby forming a resist pattern image on the toner image holding medium.

When the hot-melt transfer station is constituted by a toner image holding medium and a press roller, and a printed circuit board member obtained by laminating a metal foil on an insulating support plate is supplied to the hot-melt transfer station, the toner pattern image is automatically hot-melt-transferred onto the metal foil.

Therefore, when this apparatus is employed, no manual operations need be performed except for generating a resist pattern signal, no intermediate re-usable product, e.g., a pattern film, need be formed, and no expensive materials, chemical solutions, washing water, or the like need be used. The apparatus can be made compact. Thus, various problems occurring in the conventional etching resist pattern forming methods and apparatuses can be solved.

An arrangement will be described with reference to FIGS. 15A and 15B, in which a hot-melt transfer station is constituted by a pressure contact convey means that can bring a toner image holding medium into pressure contact with a printed circuit board member and can separate them from each other, and a pressure contact transfer means control unit is provided to separate the toner image holding medium and the printed circuit board member from each other at least when the edge of the printed circuit board member passes a transfer nip portion.

Figures 15A, 15B:
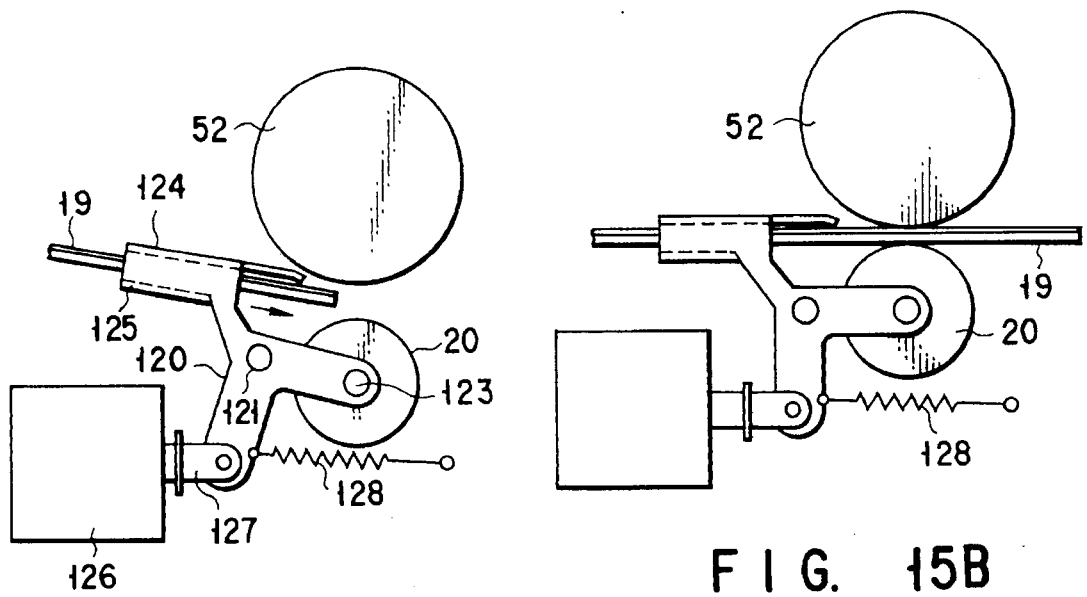

As shown in FIG. 15A, a press roller 20 is rotatably held by the first arm portion of a three-forked arm 120 through a support shaft 123. The three-forked arm 120 is mounted on a main body (not shown) to be pivotable within a vertical plane about a support shaft 121 as the center. One end of a tension spring 128 is engaged by the main body, and the other end thereof is engaged by the second arm portion of the three-forked arm 120. As a result, the three-forked arm 120 is biased to rotate counterclockwise. A plunger 127 of a solenoid 126 is pivotably connected to the second arm portion of the three-forked arm 120. When the solenoid 126 is ON, the three-forked arm 120 is rotated clockwise. A pair of guide plates 124 and 125 which are arranged in parallel with each other in a predetermined space are fixed to the third arm portion of the three-forked arm 120. A processing target material 19 travels between the guide plates 124 and 125 such that its travel position is regulated by them.

FIGS. 15A and 15B show states in the apparatus having the above arrangement wherein the solenoid 126 is ON and OFF, respectively. When the processing target material 19 is fed in a direction indicated by an arrow in FIG. 15A so that its leading end portion approaches the pressure contact portion between a roller 52 and the roller 20, i.e., the transfer nip portion that serves as a toner image hot-melt transfer portion, the solenoid 126 is turned on, and the three-forked arm 120 is pivoted clockwise. As a result, the press roller 20 is moved downward so that the two rollers 52 and 20 are separated from each other from the pressure contact state. Simultaneously, the direction of the guide path of the guide plates 124 and 125 is moved to be lower than the transfer nip portion, so that the processing target material 19 is guided so as not to contact the toner image holding medium. When the leading edge portion of the processing target material 19 passes the transfer nip portion, the solenoid 126 is turned off. As a result, as shown in FIG. 15B, the three-forked arm 120 is pivoted counterclockwise by the biasing force of the tension spring 128, and the press roller 20 is moved upward, thereby bringing the processing target material 19 into pressure contact with the toner image carrier drum.

Approach and separation of the edge portion of the processing target material (printed circuit board member) 19 and the toner image holding medium drum to and from each other are controlled by the pressure contact transfer means control unit in this manner so as to prevent the toner image holding medium from being damaged by the edge of the printed circuit board member, as will be described later.

When the printed circuit board member uses an epoxy glass or phenol plate as the base, its thickness is about 1 to 2 mm, its cutting face edge is sharp, and its material is hard. Although a flexible printed circuit board member having a polyimide film as the base is thinner than the above circuit board member and soft, it is thicker than paper and the like and thus still can damage the toner image holding medium with a high possibility.

In the apparatus shown in FIGS. 15A and 15B, when the edge of the printed circuit board member approaches the transfer nip portion, the press roller is retreated, and the guide plates of the printed circuit board member are moved, so that the printed circuit board member is guided such that its edge will not abut against the toner image holding medium. As a result, the sharp edge of the printed circuit board member is prevented from damaging the surface of the toner image holding medium, or is prevented from entering the nip portion to generate noise or vibration, so disturbance will not occur in electrostatic latent image formation or toner development.

Therefore, according to this apparatus, an etching resist pattern can be formed even on the surface of a printed circuit board member having a sharply cut end face or of a printed circuit board member having a large thickness without any problem.

The press roller is also controlled while the trailing edge of the printed circuit board member passes, as a matter of course.

An apparatus according to the sixth embodiment of the present invention will be described with reference to FIG. 16, which is obtained by providing a printed circuit board member sensor for obtaining a control signal for the pressure contact transfer means to the apparatus described with reference to FIG. 15A.

More specifically, in this embodiment, in the etching resist pattern forming apparatus described with reference to FIG. 15A, a sensor for detecting a printed circuit board member is provided on the upstream side of the transfer station of the printed circuit board member convey path, and a control means for controlling pressure contact and separation of the pressure contact transfer means based on the detection signal from the sensor is provided.

Figure 16:
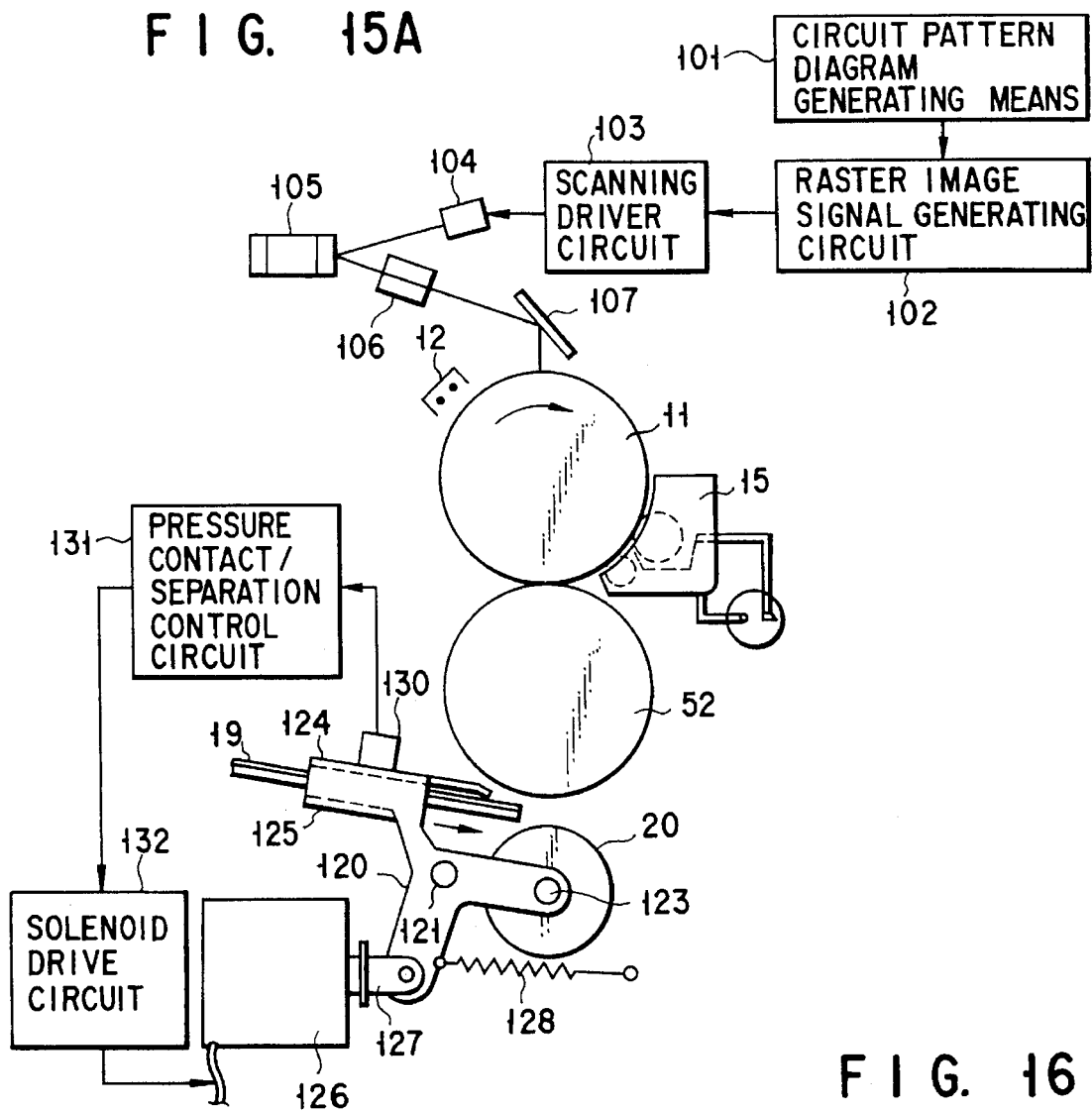
FIG. 16 is a schematic view for explaining a resist pattern forming apparatus according to the sixth embodiment of the present invention, which is provided with a printed circuit board member sensor for obtaining a control signal of the pressure contact transfer means.

Referring to FIG. 16, reference numeral 130 denotes a printed circuit board member sensor. The printed circuit board member sensor 130 is provided on the upstream side of the pressure contact portion of a toner image holding medium and a press roller 20 that constitute a toner image hot-melt transfer station.

When the edge of a printed circuit board member passes it, the sensor 130 detects this, and a detection signal is sent from the sensor 130 to a pressure contact/separation control circuit 131. As a result, the circuit 131 outputs a control signal to a solenoid drive circuit 132. The solenoid drive circuit 132 turns on a solenoid 126, thereby separating the press roller 20 from the toner image holding medium.

When a predetermined period of time has elapsed after the sensor 130 outputs the signal, or when a printed circuit board member convey unit (not shown) outputs a board member moving amount signal, the pressure contact/separation control circuit 131 outputs a signal again to turn off the solenoid 126, and the press roller 20 is brought into pressure contact with the toner image holding medium.

As described above, according to the arrangement shown in FIG. 16, pressure contact and separation of the pressure contact transfer means can be reliably controlled and the toner image holding medium can be reliably prevented from being damaged with a simple structure.

An apparatus for forming a resist pattern on a printed circuit board according to the seventh embodiment, which can be precisely controlled, will be described with reference to FIGS. 17A and 17B.

Figure 17A:
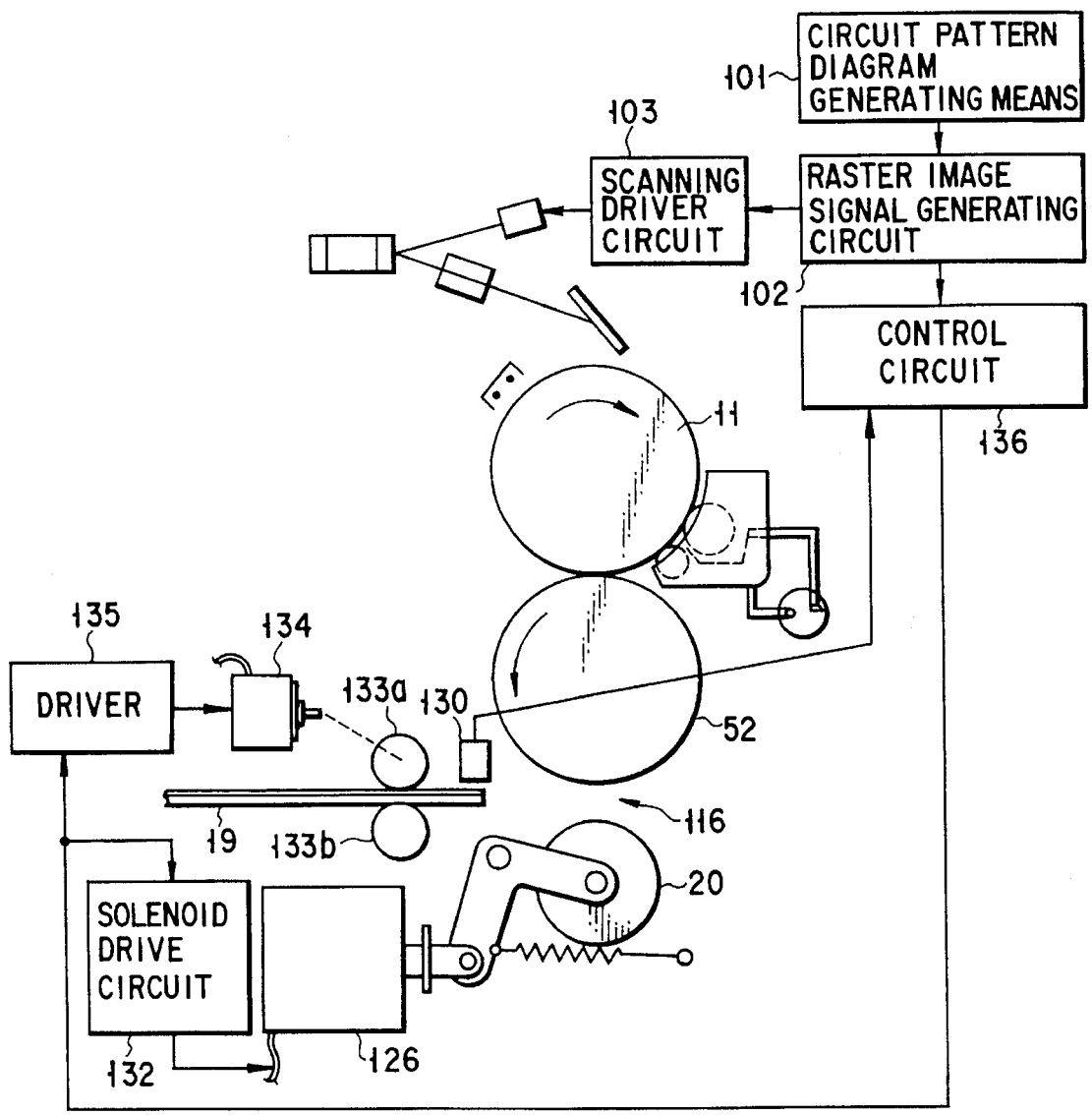

The apparatus shown in FIG. 17A is obtained by adding, to the apparatus described with reference to FIG. 16, a control means for temporarily stopping convey of a printed circuit board member at an upstream side of a transfer station based on a detection signal from a printed circuit board member sensor and resuming convey of the printed circuit board member in synchronism with a shift in forming position of a toner pattern on a toner image holding medium.

When the leading end of a processing target material (printed circuit board member) 19 approaches a printed circuit board member sensor 130, the sensor 130 detects this and sends a detection signal to a central control circuit 136. The control circuit 136 is a central control circuit for controlling the flow of a circuit pattern diagram signal, information on positions where an electrostatic latent image and a toner image are formed, the overall operation position timing, and the like. The processing target material 19 is sandwiched between convey rollers 133a and 133b and is conveyed farther forward. One convey roller 133a is a driving roller which is rotated upon reception of a drive force from a motor 134, and the other convey roller 133b is a driven roller. The motor 134 is driven by a driver 135. A solenoid 126 that causes a press roller 20 to approach and separate is driven by a solenoid drive circuit 132. Both the motor driver 135 and the solenoid drive circuit 132 receive an instruction from the central control circuit 136 and operate in the manner as described above.

Figure 17B:
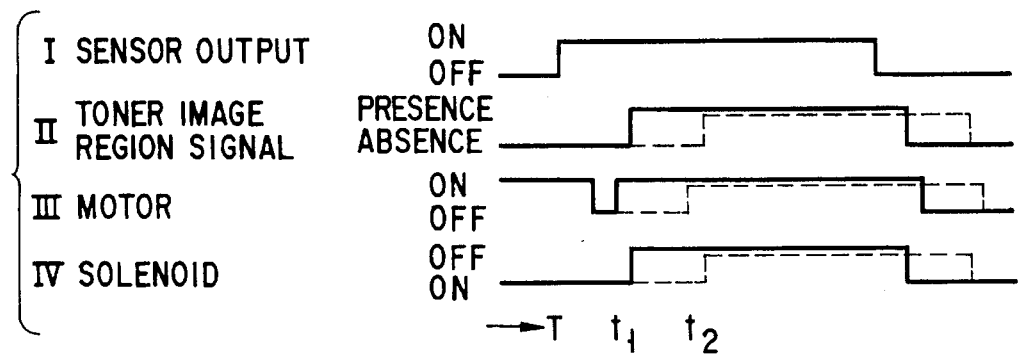

FIG. 17B is a flow chart for explaining the above operation control. Reference numeral I denotes an output signal from the printed circuit board member sensor 130; II, a signal indicating a period during which a toner image forming region passes the pressure contact transfer unit; III, an operation control signal to the driver 135 of the motor 134; and IV, an operation control signal to the solenoid drive circuit 132. The axis of abscissa indicates the lapse of time.

First, the apparatus is started, and a circuit pattern signal is output. Based on the circuit pattern signal, the optical write scanning means, the developing unit, and the like are also operated, and a toner image is transferred onto an intermediate transfer drum 52 serving as an toner image holding medium. When the toner image approaches a pressure contact transfer unit 116 upon rotation of the drum 52, the central control circuit 136 predicts this timing in advance and feeds the printed circuit board member 19. Convey of the printed circuit board member 19 is controlled by the convey rollers 133a and 133b. The board member is controlled such that it is fed sufficiently before the toner image comes to the pressure contact transfer unit 116. When the sensor 130 detects the leading end of the board member 19, a detection signal indicating this is sent to the central control circuit 136. Based on its determination, the central control circuit 136 generates an instruction prior to a timing $t_1$ at which the leading end of the toner image forming region approaches the pressure contact transfer unit 116. As a result, the motor 134 is rotated. At the timing $t_1$ slightly after this, the solenoid 126 is turned off, so that the printed circuit board member 19 is brought into pressure contact with the drum 52 by the press roller 20. When the leading end of the printed circuit board member 19 enters the pressure contact transfer unit 116, since the solenoid 126 is ON to push down the press roller 20, the edge of the printed circuit board member 19 will not damage the surface of the intermediate transfer drum 52 serving as the toner image holding medium. Subsequently, the toner image on the drum 52 is transferred onto the printed circuit board member 19 with registration. As the trailing end of the toner image forming region passes the pressure contact transfer unit 116, the solenoid 126 is turned on, and the pressure contact state of the press roller 20 is canceled.

When the trailing end of the printed circuit board member 19 is close to the terminal end of the toner image forming region, its trailing end has already been away from the convey rollers 133a and 133b, is transferred to a roller (not shown) on the downstream side of the pressure contact transfer unit 116, and is conveyed.

In FIG. 17B, broken lines indicate the operation timings of the motor 134 and the solenoid 126 obtained when the leading end of the toner image forming region approaches the pressure contact transfer unit 116 at a timing $t_2$ in accordance with the determination of the central control circuit 136. This means that convey start of the printed circuit board member 19 and pressure contact of the press roller 20 are in synchronism with each other.

The convey of the toner resist pattern image during hot-melt transfer must be interlocked with rotation of the toner image holding medium drum 52. Thus, the rotation of the convey rollers 133a and 133b is not limited by the motor 134. The convey rollers 133a and 133b may be driven through a one-way rotating clutch, or a mechanism for separating the convey rollers 133a and 133b may be provided, so the convey rollers 133a and 133b will not influence conveyance.

According to the above arrangement, even when write of the resist pattern is started first and feed of the printed circuit board member is started after this, or even when the precision of feed start of the printed circuit board member cannot be set high because of the mechanical control, the resist pattern transfer position on the printed circuit board member can be accurately registered. Also, a means for registering the resist pattern forming position can be simplified while preventing damage to the toner image forming medium.

Figure 18A:
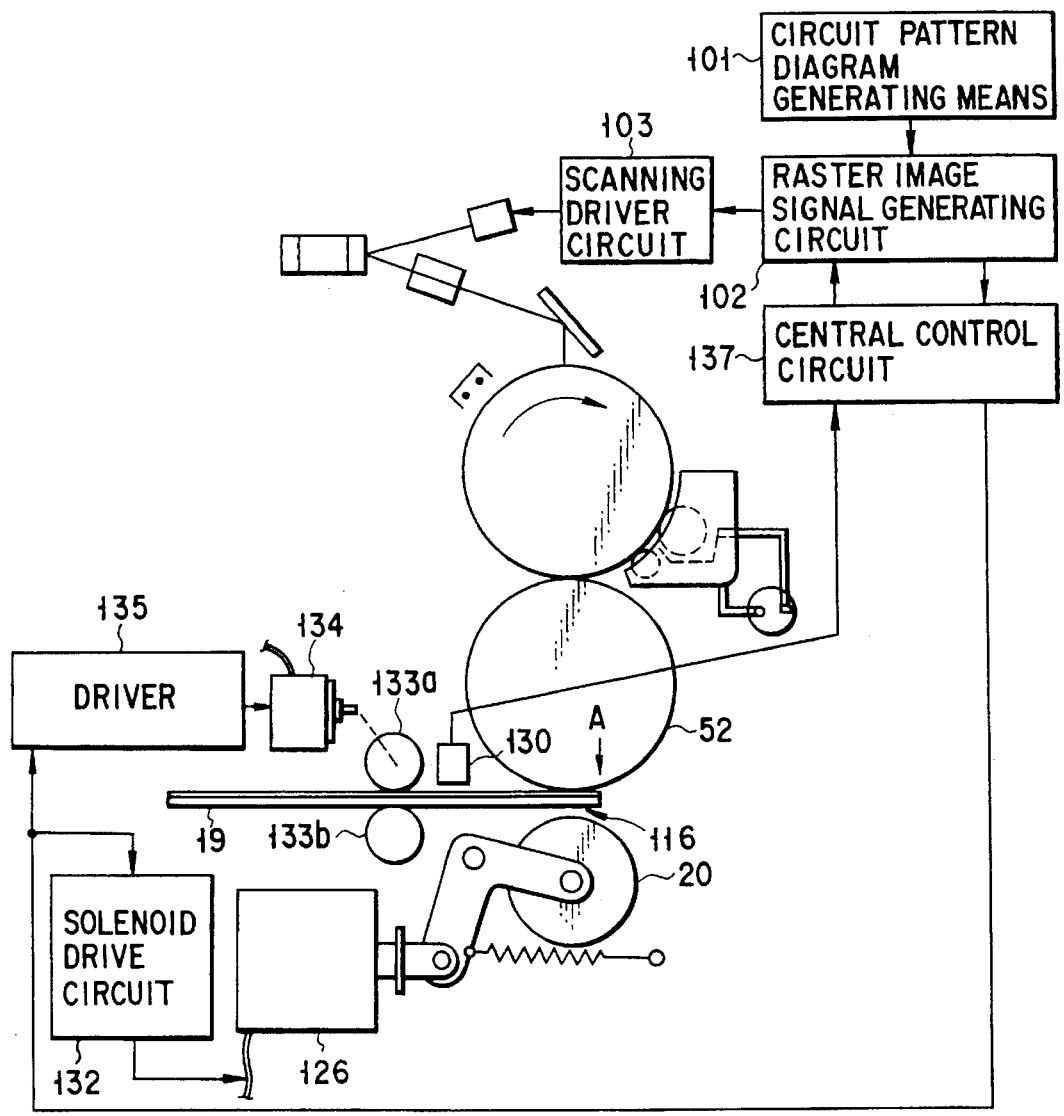

An apparatus according to the eighth embodiment, in which the position of the resist pattern to be formed on the printed circuit board member can be accurately controlled, will be described with reference to FIG. 18A. The apparatus shown in FIG. 18A is obtained by adding a control means to the apparatus described with reference to FIG. 16. While the pressure contact transfer unit of a transfer station is separated based on a detection signal from a printed circuit board member sensor, when the leading end edge portion of a printed circuit board member passes a pressure contact transfer unit, this control means temporarily stops conveying the printed circuit board member. When the leading end of a resist pattern toner image on the toner image carrier member has moved to the pressure contact transfer unit, this control means brings the toner image holding medium into pressure contact with the printed circuit board member at the pressure contact transfer unit, and then resumes to convey the printed circuit board member.

This apparatus is constituted by the same combination as that of the arrangement of FIG. 17A except for a central control circuit 137. Since this apparatus is different from that of FIG. 17A only in control of the central control circuit 137, the central control circuit 137 will mainly be described.

Write by the print head is started, and development of an electrostatic latent image, intermediate transfer onto the toner image holding medium, and the like progress as a series of processing operations. The central control circuit 137 predicts a timing $t_1$ (shown in FIG. 18B) at which the leading end of the toner image forming region on the toner image holding medium (drum 52) approaches a pressure contact transfer unit 116 in advance, and starts feeding a printed circuit board member 19 prior to the timing $t_1$ by a predetermined period of time. For this reason, when a motor 134 is driven to convey the printed circuit board member 19, and the leading end of the printed circuit board member 19 is detected by a sensor 130, a detection signal indicating this is sent to the central control circuit 137. As a result, the central control circuit 137 instructs a driver circuit 135 to supply power to the motor 134 for a period of time necessary for the leading end of the printed circuit board member 19 to pass the pressure contact transfer unit 116 and then reach a predetermined position A. After that, the printed circuit board member is temporarily stopped.

At the timing $t_1$ at which the leading end of the toner image forming region approaches the pressure contact transfer unit 116, a solenoid 126 is deenergized by an instruction from the central control circuit 137. Thus, the solenoid 126, which has been ON before this and keeps separating a press roller 20, is switched into a pressure contact state.

When a strong convey force acts on the toner image holding medium 52, the printed circuit board member is conveyed without any problem and resist pattern transfer to it is performed only by connecting a convey roller 133a to the motor 134 through a one-way clutch. When the convey force of the toner image holding medium 52 is weak, the convey roller 133a may be separated from a convey roller 133b, or the motor 134 may be turned on to apply a weak convey force, thereby aiding the convey operation.

After the terminal end of the toner image forming region passes the pressure contact transfer unit 116, the solenoid 126 is energized again before the trailing edge of the printed circuit board member 19 is away from the pressure contact transfer unit 116, so that pressure contact by the press roller 20 is canceled.

Figure 18B:
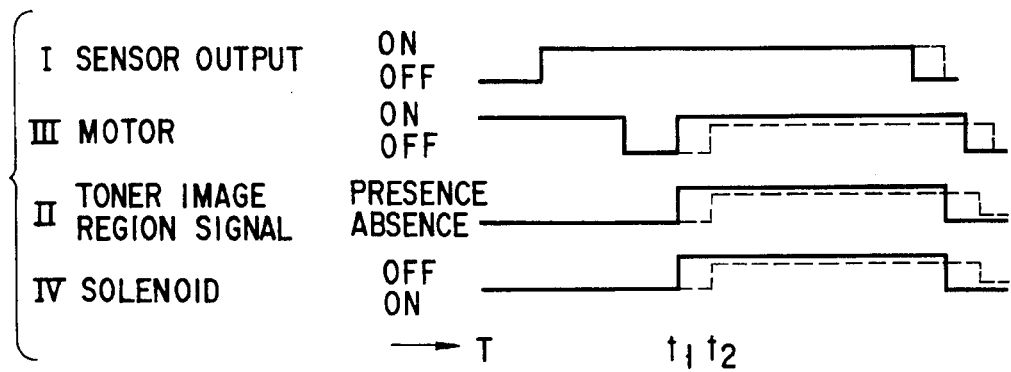

Referring to FIG. 18B, broken lines indicate operation timings of the respective units obtained when the leading end of the toner image forming region reaches the pressure contact transfer unit 116 at a timing $t_2$ with a delay.

According to the etching resist pattern forming apparatus having the above arrangement, the printed circuit board member is temporarily stopped when its leading end passes the pressure contact transfer unit, and is resumed to be conveyed when the resist pattern toner image approaches this position. Therefore, accurate position registration can be performed.

Therefore, with the arrangement of the apparatus according to the present invention, an etching resist pattern forming apparatus in which damage to the toner image holding medium is prevented and which has a high registration precision with a simple arrangement can be realized.

A printed circuit board etching resist pattern forming apparatus according to the ninth embodiment of the present invention, in which damage to the toner image holding medium is prevented, will be described with reference to FIGS. 19A and 19B.

This apparatus is obtained by disposing, in the apparatus described with reference to FIG. 14, protection films for the toner image holding medium at positions corresponding to the widthwise edge portions of a printed circuit board member in a pressure contact transfer unit of the printed circuit board member and the toner image holding medium.

Figure 19A:
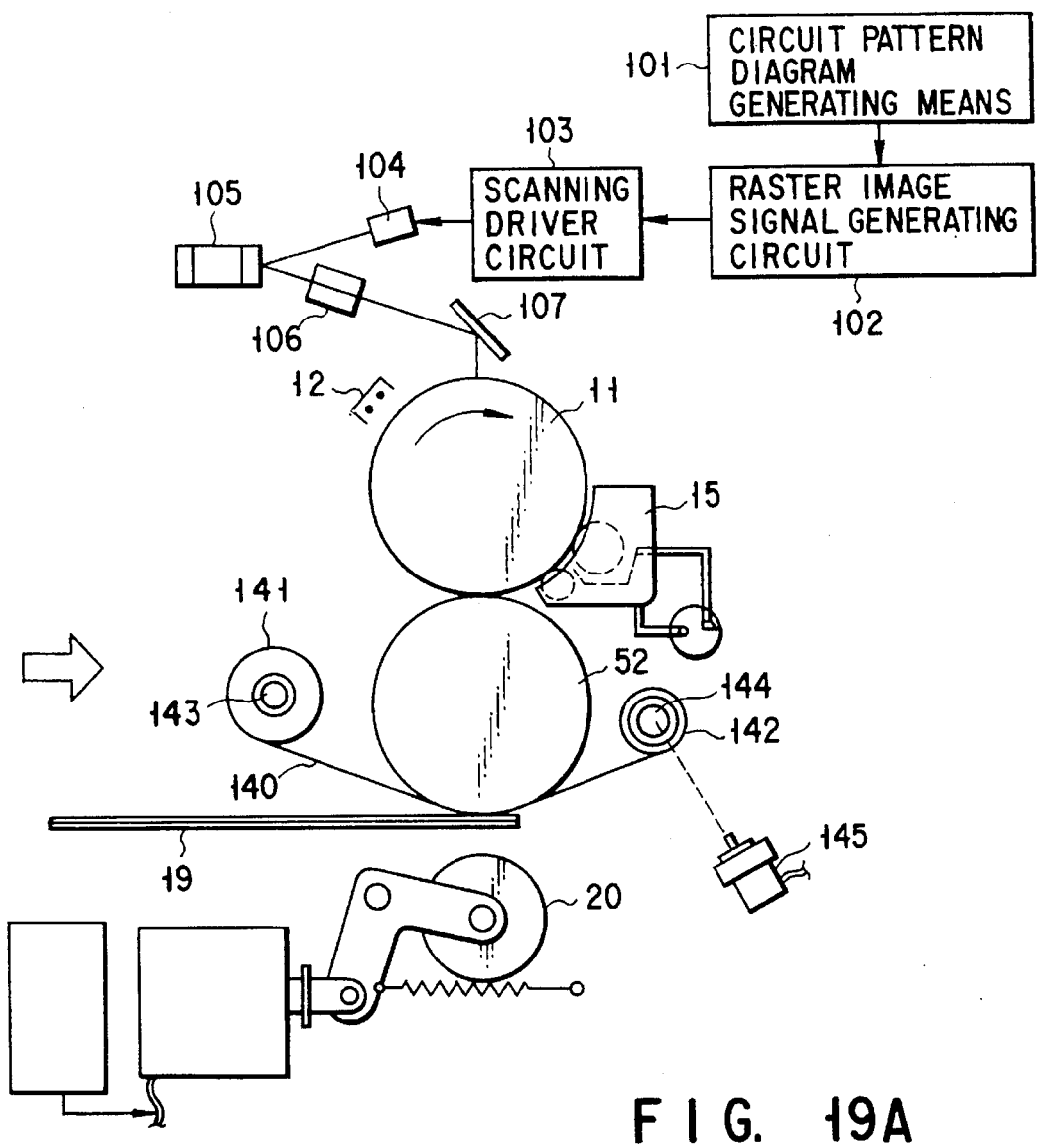
Figure 19B:
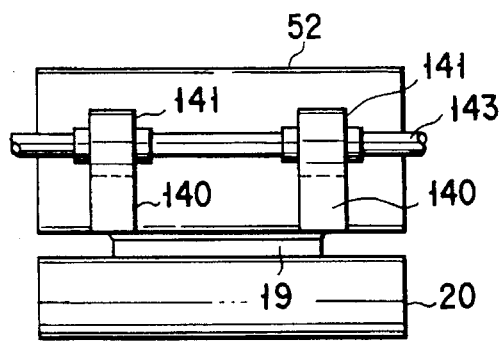

FIG. 19A is a view showing the arrangement of the apparatus seen from a side, and FIG. 19B is a partial side view seen from a direction indicated by an arrow in FIG. 19A. Referring to FIGS. 19A and 19B, newly added constituent elements are feed rolls 141 for a pair of protection films 140, take-up rolls 142, shafts 143 and 144 of the feed rolls 141 and the take-up rolls 142, respectively, and a take-up motor 145. The roll shafts 143 and 144 are mounted to a main body (not shown) to be rotatable about axes, which are parallel to the rotation shaft of the drum 52, as the centers, and sandwich the drum 52. The pair of feed rolls 141 are coaxially fixed to one roll shaft 143 to be separated from each other at a predetermined gap. The pair of take-up rolls 142 are coaxially fixed to the other roll shaft 144 to correspond to the feed rolls 141. The protection films 140 are wound on the respective feed rolls 141. The protection films 140 are in slidable contact with the lower surface of the drum 52, and the leading ends of the protection films 140 are locked by the take-up rolls 142. The motor 145 is connected to the take-up roll shaft 144 so as to rotate it counterclockwise in FIG. 19A.

As the protection films 140, heat-resistant, high-strength films, e.g., polyester films having a thickness not less than several microns and not more than 20 microns, are appropriate. The two protection films 140 are in contact with the circumferential portions of the toner image holding medium drum 52 near its two end portions. Since the protection films 140 are in slidable contact with the two side edges of a printed circuit board member 19, the two side edges of the printed circuit board member 19 do not directly contact the circumferential surface of the drum 52.

For this purpose, the protection films 140 are respectively fed out from the feed rolls 141 and taken up by the take-up rolls 142 in synchronism with rotation of the drum 52. The protection films 140 are arranged at right and left portions to correspond to the widthwise edge portions of the printed circuit board member 19. Each protection film 140 preferably has a width ranging from about 10 to 20 mm so that it will not interfere with the resist pattern forming region. The central line of each protection film 140 preferably coincides with the corresponding edge of the printed circuit board member 19.

The printed circuit board members serving as the processing target members 19 are classified into hard members containing epoxy glass, phenol, or the like as the base material, and flexible members containing polyimide as the base material. The protection films 140 can be applied to either type. The board members 19 may be supplied in the form of separate cut sheets, or of one rolled board member. In any case, when a printed circuit board member is supplied and a press roller 20 is brought into contact with it, the toner image holding medium drum 52, the protection films 140, the printed circuit board member 19, and the press roller 20 are moved at the same peripheral or linear velocity.

When a hard printed circuit board member is used, generally its thickness is about 1 to several mm, its cut edge is sharp, and its material is hard. In this case, when this printed circuit board member is directly brought into pressure contact with the toner image holding medium from the press roller, it damages the surface of the toner image holding medium. When a flexible printed circuit board member is used, it is generally thicker and harder than soft members, e.g., paper. Therefore, in the long run, it damages the surface of the toner image holding medium with its edge.

Regarding these problems, according to the above etching resist pattern forming apparatus, damage to the surface of the toner image holding medium caused by the two end edges of the printed circuit board member in the widthwise direction can be prevented by the protection films present between the toner image holding medium and the printed circuit board member. As these protection films are moved at the same velocity as that of the printed circuit board member and the toner image holding medium, they will not interfere with the convey of the printed circuit board member and the toner image holding medium. As the protection films are thin films arranged only to correspond to the edge portions of the printed circuit board member, they will not interfere with hot-melt transfer of the toner image. Therefore, with the above arrangement, an etching resist pattern forming apparatus having a long-life toner image holding medium can be realized.

A printed circuit board member etching resist pattern forming apparatus according to the 10th embodiment of the present invention, in which simplification of the apparatus and improvement in reliability are realized by employing an intermediate transfer belt, will be described with reference to FIG. 20.

Figure 20:
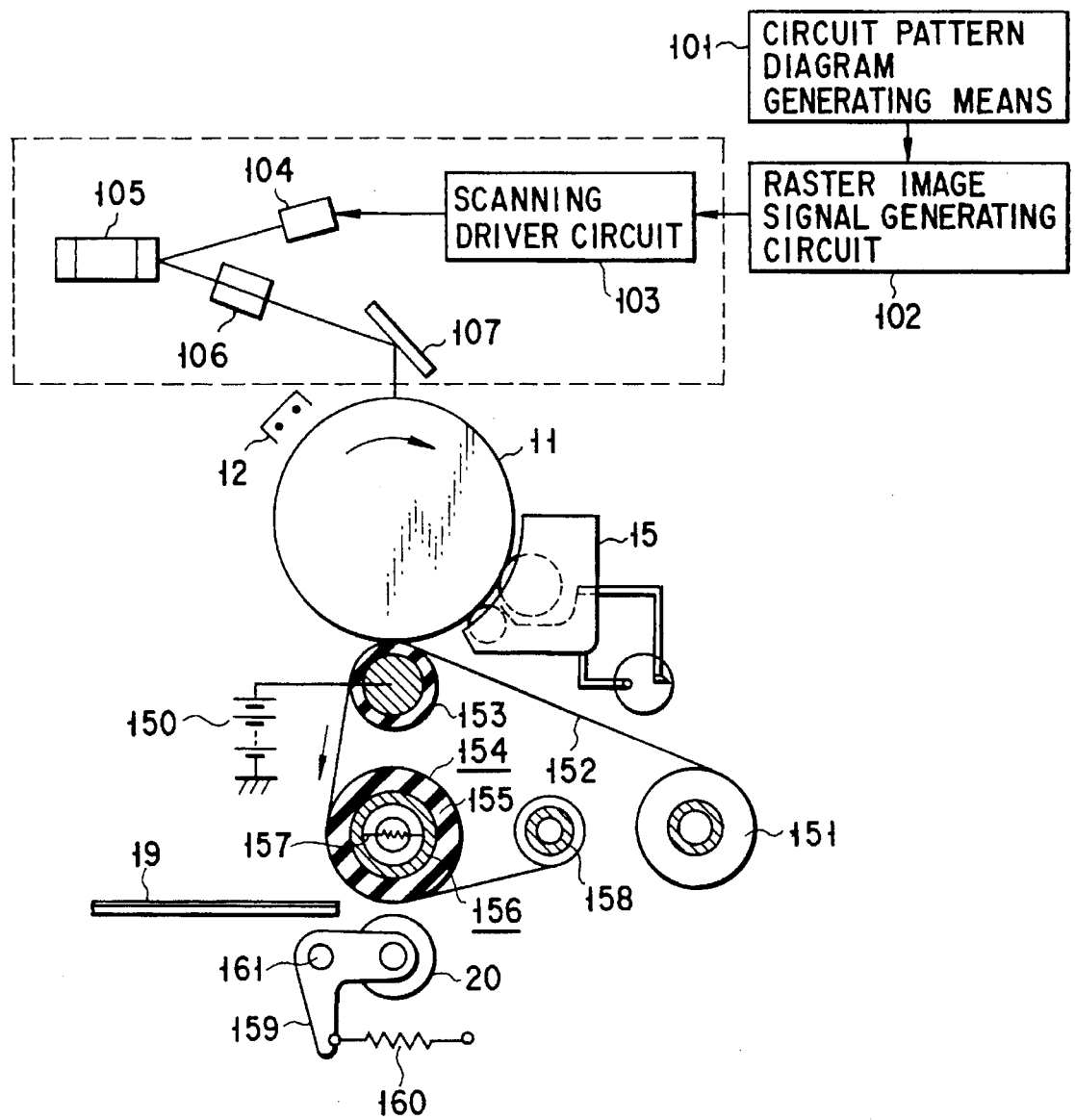
FIG. 20 is a schematic view for explaining an apparatus according to the 10th embodiment that uses an intermediate transfer belt.

The apparatus shown in FIG. 20 is constituted by a means (101 to 103) for generating a printed circuit pattern diagram signal, an optical write head (104 to 107) which operates in response to the pattern signal, an electrophotographic photosensitive body 11, a developing unit 15 employing a hot-melt toner, an intermediate transfer belt 152 supplied from a roll, and a hot-melt transfer heat roller or pressure contact transfer means 154 for melting the toner image on the transfer belt 152 by heating and hot-melt-transferring it onto a printed circuit board member 19.

In this embodiment, a feed roll 151, a bias transfer roller 153, and a take-up roll 158 are mounted to the main body (not shown) to be rotatable about shafts parallel to the shaft of the hot-melt transfer heat roller 154. The intermediate transfer belt 152 is wound on the feed roll 151, and passes between the electrophotographic photosensitive body 11 and the bias transfer roller 153, is brought into slidable with the lower surface of the hot-melt transfer heat roller 154, and is taken up by the take-up roll 158. The bias transfer roller 153 brings the intermediate transfer belt 152 into pressure contact with the electrophotographic photosensitive body 11, and receives a bias voltage from a power supply 150. The hot-melt transfer heat roller 154 is obtained by covering the outer circumferential surface of a core metal 156 with a heat-resistant elastic cover layer 155, and incorporates a heater 157.

A press roller 20 is rotatably supported at one arm portion of an L-shaped arm 159 which is pivotally mounted on a shaft 161 fixed to the main body. The other arm portion of the L-shaped arm 159 is connected to one end of a tension spring 160 having the other end engaged by the main body. As a result, the L-shaped arm 159 is constantly biased counterclockwise by a spring 160, so that the press roller 20 is biased toward the hot-melt transfer heat roller 154 (in the pressure contact direction).

The belt 152 is a belt for intermediately transferring a toner image and can be one having a thickness of several microns to several hundred microns. Preferably, the intermediate transfer belt 152 has a thickness of about 20 microns to several ten microns. A polyester film is suitable as the intermediate transfer belt 152 since it is heat resistant and inexpensive.

A bias voltage having an opposite polarity to that of the charges of the developed toner image on the electrophotographic photosensitive body 11 is applied from the power supply 150 to the bias transfer roller 153, so that the developed toner image is transferred onto the belt 152. The bias transfer roller 153 is obtained by covering the surface of the core metal with conductive rubber, so that the belt 152 is brought into pressure contact with the electrophotographic photosensitive body 11 with a high adhesion state.

A method of transferring the toner from the electrophotographic photosensitive drum 11 to the intermediate transfer belt 152 is not limited to the above described one based on the static electricity, but hot-melt transfer may be performed by using the bias transfer roller 153 as the heat roller.

The hot-melt toner image transferred onto the intermediate transfer belt 152 is heated at the hot-melt transfer heat roller 154 and set in the molten state. The printed circuit board member (processing target member) 19, which is fed in synchronism with the movement of the toner image, and the intermediate transfer belt 152 are brought into pressure contact by the operation of the press roller 20, and the toner image on the belt 152 is hot-melt-transferred onto the printed circuit board member 19. At this time, although the printed circuit board member is not so flexible as paper, since the hot-melt transfer heat roller 154 has the heat-resistant elastic cover layer 155, the belt is brought into tight contact with the surface of the printed circuit board member 19 with a high adhesion, thereby performing transfer free from non-uniformity.

When the printed circuit board member has a large heat capacity or high thermal conductivity, the hot-melt toner image is sometimes undesirably cooled and solidified before it is brought in a wet state with respect to the printed circuit board member. In this case, it is preferable to provide a heating means on the upstream side of the pressure contact transfer unit of the printed circuit board member convey path, and the printed circuit board member may be preheated, so that a high adhesion state of the transfer toner image is maintained.

According to the etching resist pattern forming apparatus described above, even if the leading and trailing edges or the two widthwise edges of the printed circuit board member damage the toner image holding medium, the intermediate transfer belt serving as a disposable toner image holding medium is discarded after it is used once or several times before an adverse influence of the damage occurs. Therefore, no problem occurs.

Therefore, with the above arrangement, a complicated apparatus arrangement aiming at prevention of damage caused by the edge of the printed circuit board member becomes unnecessary, and thus a simplified, high-reliability etching resist pattern forming apparatus can be realized.

An etching resist pattern forming apparatus according to the 11th embodiment, in which a means for increasing precision of processing registration in post-processing is added, will be described with reference to FIG. 21A.

This apparatus has a registration mark signal circuit 161 and a print image signal circuit 162. The registration mark signal circuit 161 replaces the raster image signal generating circuit of the apparatus described with reference to FIG. 14, and synthesizes a registration mark signal with a circuit pattern diagram signal to form a print image signal. The print image signal circuit 162 drives the print head based on the print image signal, thereby forming an electrostatic latent image. As a result, a registration mark pattern is formed outside a printed circuit pattern region. This is the characteristic feature of this apparatus.

The registration mark signal circuit 161 is a circuit unit which stores or generates a signal indicating the shape of a mark used for registration, mark coordinate information, and the like. The print image signal circuit 162 synthesizes the circuit pattern diagram signal sent from a circuit pattern diagram generating means 101 and a registration mark signal sent from the registration mark signal circuit 161 on the same screen and converts the synthesized signal into a print image signal suitable for a scanning driver circuit 103.

FIG. 21B shows a pattern diagram formed on one printed circuit board member (processing target member) 19, in which reference symbols P denote the regions of the circuit pattern diagram. The same pattern diagram is repeatedly formed. Reference symbols RMa and RMb denote registration mark signals made of a symbol +. It is preferable that a plurality of registration mark signals be provided for one printed circuit pattern diagram.

The registration mark signal synthesized with the circuit drawing signal into the print image signal in this manner is converted into an electrostatic latent image, converted into a visible image with a toner, and transferred onto the same surface of the printed circuit board member as the etching resist pattern and the registration mark.

Therefore, according to the etching resist pattern forming apparatus described above, an etching resist pattern and a toner image of a registration mark can be transferred onto the surface of a printed circuit board member with a registration mark pattern signal synthesized with a printed circuit diagram pattern signal, and registration in the additional processing steps can be performed with reference to the registration mark.

The additional processing steps include the step of forming an etching resist pattern on the lower surface of a printed circuit board member to form a two-sided printed circuit board member, the step of forming holes for the purpose of parts mounting, the step of forming a solder resist pattern, and the like.

Therefore, with the above arrangement, a printed circuit board etching resist pattern forming apparatus, which can print a registration mark used for accurate registration in the additional processing steps, can be realized.

An etching resist pattern forming apparatus for a two-sided printed circuit board member according to the 12th embodiment, which is formed based on the etching resist pattern forming apparatus shown in FIG. 21A, will be described with reference to FIG. 22.

Figure 22:
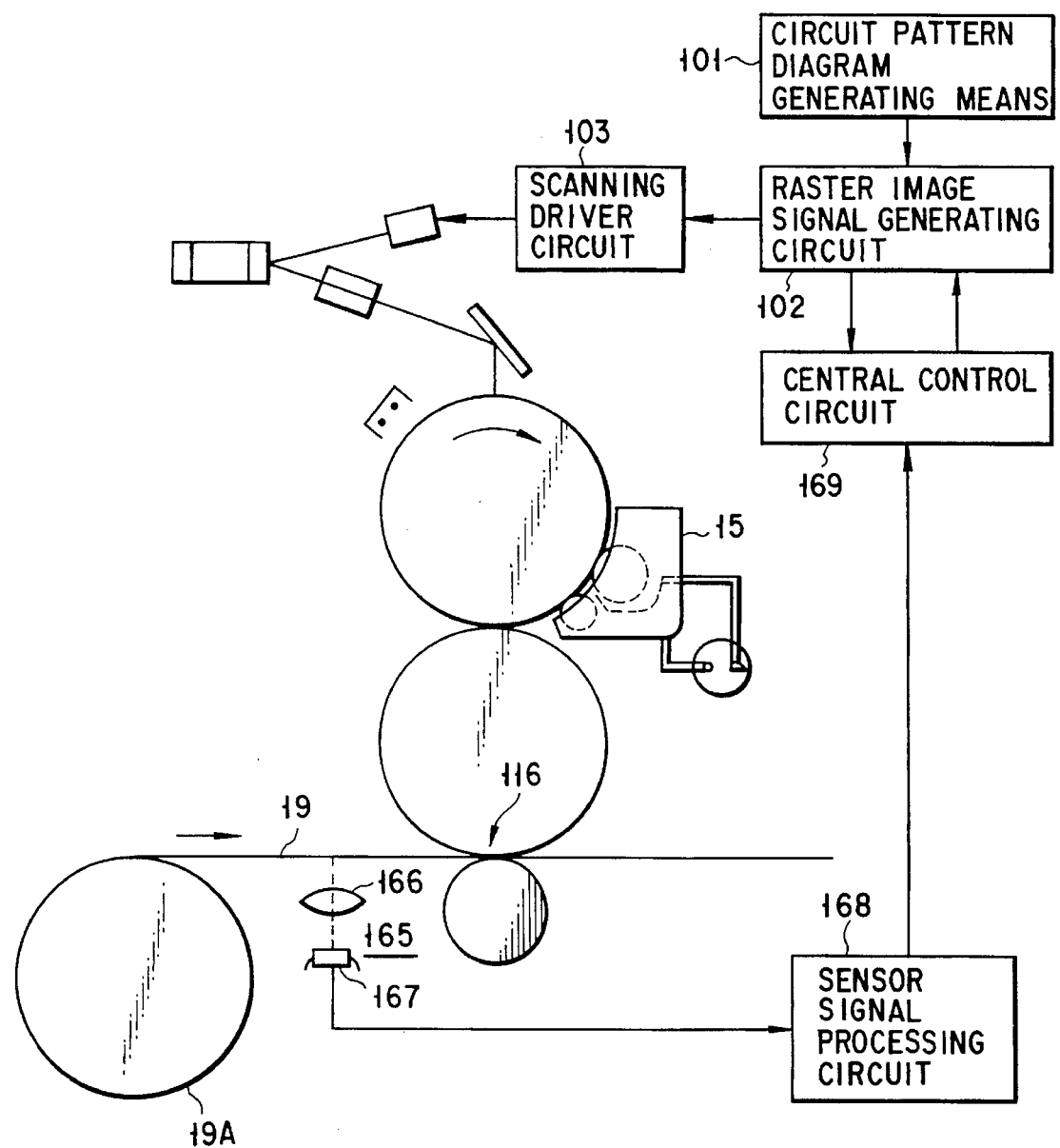
FIG. 22 is a schematic view for explaining an etching resist pattern forming apparatus for a two-sided printed circuit board member according to the 12th embodiment.

The apparatus shown in FIG. 22 is obtained by providing, to the apparatus shown in FIG. 14 or 21A, a sensor and a control means. The sensor reads the registration mark on one surface of the printed circuit board member near a hot-melt pressure contact transfer unit on the printed circuit board member convey path. The control means controls the position for forming an etching resist pattern which is to be formed on the other surface of the printed circuit board member based on the read signal from this sensor.

Referring to FIG. 22, reference numeral 19A denotes a roll of a flexible printed circuit board member on one surface on which an etching resist pattern and a registration mark pattern are formed. A printed circuit board member (processing target member) 19 is drawn from the roll 19A. Near a hot-melt pressure contact transfer unit 116, a pair of sensors 165 for reading registration marks RMa and RMb formed on one surface of the printed circuit board member are provided on the upstream side of the pressure contact transfer unit 116 in the convey direction of the printed circuit board member 19, to be separated from each other in the widthwise direction of the board member. Each sensor comprises a projection lens 166, an illumination lamp (not shown), a CCD image sensor 167, and the like.

A signal from each CCD image sensor 167 is sent to a sensor signal processing circuit 168 to calculate the position of the mark RMa or RMb. A position information signal output from the sensor signal processing circuit 168 is sent to a central control circuit 169. The central control circuit 169 controls the signal position of the print image signal in accordance with the travel position information of the processing target member 19 based on the signal from the registration sensor, and outputs a control instruction to a raster image signal generating circuit 102 so that an etching resist pattern is formed on the other surface of the processing target member 19 to be registered with the etching resist pattern which is already formed on one surface of the processing target member 19.

In the embodiment shown in FIG. 22, the etching resist pattern and the registration marks are written on one surface of the flexible printed circuit board member once, the flexible printed circuit board member is drawn from the roll which has taken up the flexible printed circuit board member, and the etching registration mark is formed on the other surface of the flexible printed circuit board member. Alternatively, two units, each of which performs hot-melt toner pattern formation and hot-melt transfer and has been described with reference to FIGS. 14 and 22, may be provided, and etching resist patterns may be formed on the two surfaces of the flexible printed circuit board member while the flexible printed circuit board member is continuously fed. In this case, the forming position of the etching resist pattern which is to be formed on the other surface is controlled based on the signal obtained by reading the registration mark formed on one surface.

According to the etching resist pattern forming apparatus described above, a registration mark, which has been formed on one surface of a printed circuit board member simultaneously in forming an etching resist pattern on the same surface, is read, and another etching resist pattern is formed on the other surface to be registered with the first pattern on one surface. In this case, the registration mark used for registration is registered with the resist pattern on one surface at high precision. Therefore, the second resist pattern which is to be formed on the other surface to be registered with this registration mark can be registered with the first resist pattern, which has already been formed on one surface, at high precision.

Therefore, with the above arrangement, a high-precision resist pattern forming apparatus for a two-sided printed circuit board member can be realized.

An apparatus according to the 13th embodiment, obtained by providing a correcting means for registration between the printed circuit patterns on the two surfaces of a printed circuit board member to the etching resist pattern forming apparatus shown in FIG. 22, will be described with reference to FIG. 23.

The apparatus shown in FIG. 23 has, in addition to the arrangement described with reference to FIG. 22, two sensors, a roll support unit, and a control circuit. Near a hot-melt pressure contact transfer unit of the convey path of the printed circuit board member, the two sensors are arranged to be separated from each other in a direction perpendicular to the feed direction of the printed circuit board member and to read the registration mark formed on one surface of the printed circuit board member. The roll support unit supports the printed circuit board member wound in a roll manner and having one surface on which an etching resist pattern and a registration mark are formed, and includes a skew-correcting moving mechanism. The control circuit controls the skew-correcting moving mechanism based on the detection outputs from the sensors.

Figure 23:
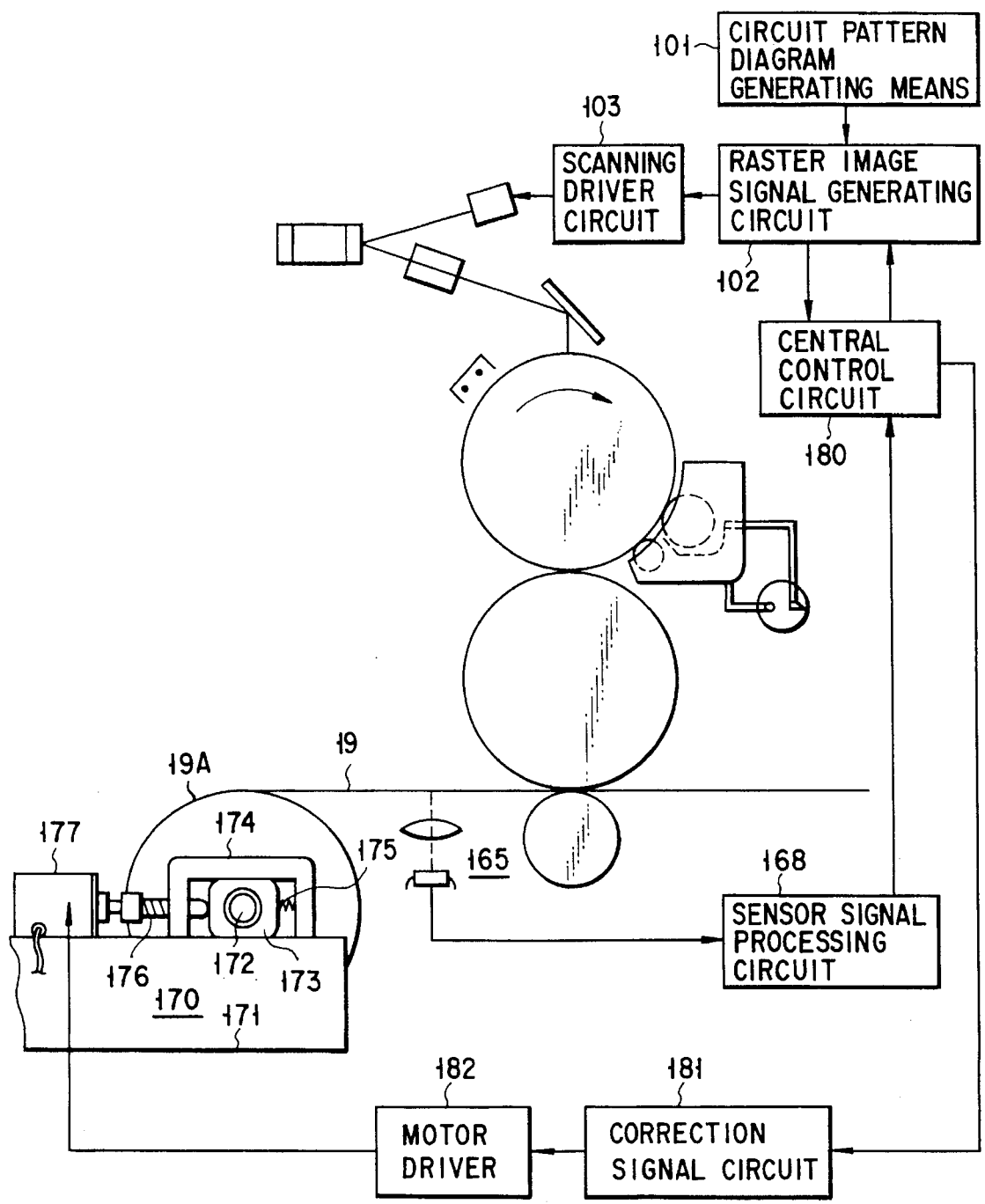
FIG. 23 is a partial elevational and schematic view for explaining an apparatus according to the 13th embodiment provided with a correcting means for registration of two-sided printed circuit patterns on the two surfaces.
Figure 26:
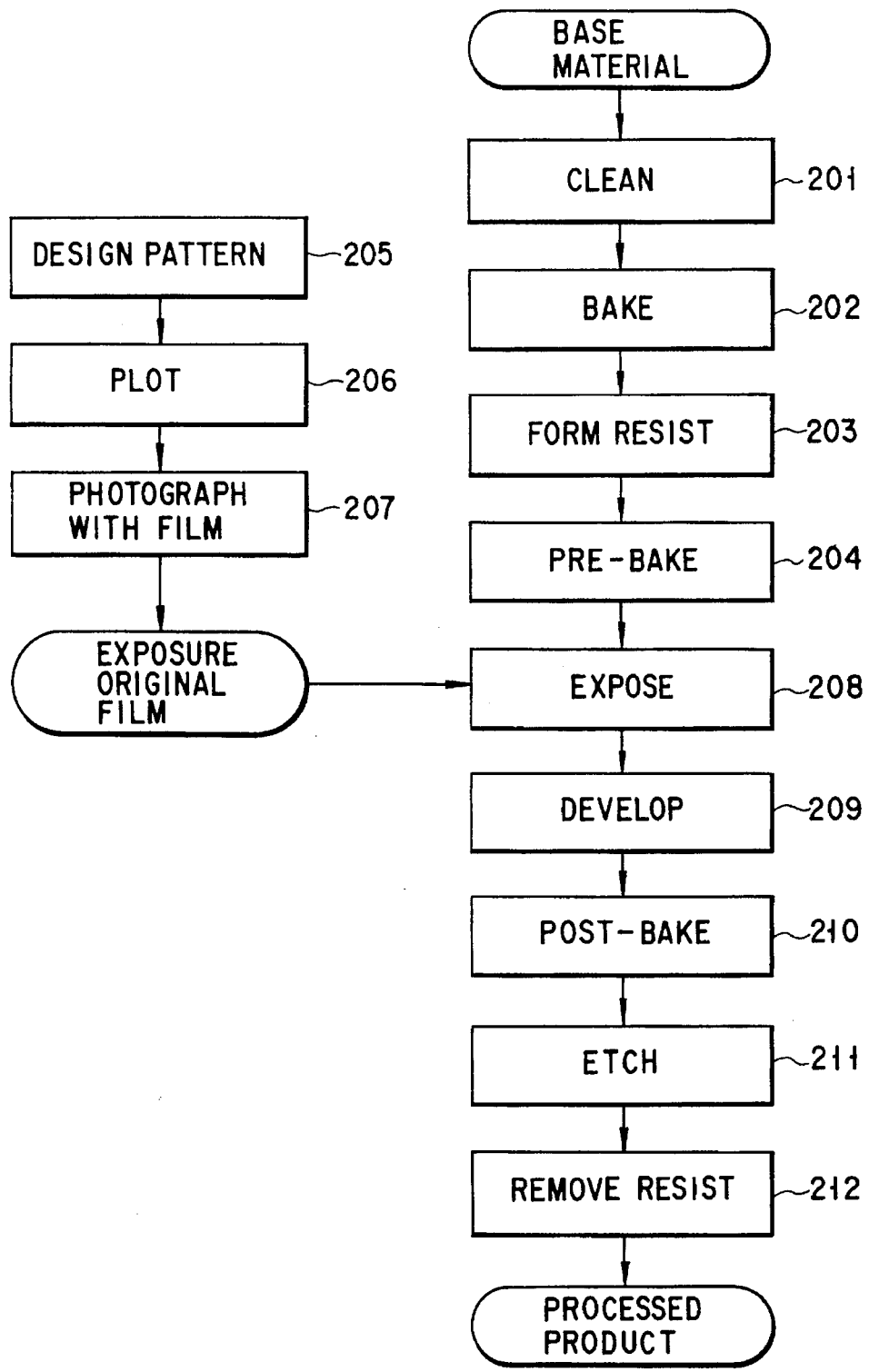
FIG. 26 is a flow chart for explaining a conventional etching method.

Referring to FIG. 23, reference numeral 172 denotes a support shaft of the roll 19A of the printed circuit board member on one surface on which the etching resist pattern and the registration mark are formed. The support shaft 172 is rotatably supported by a bearing 173. The bearing 173 is fitted in a guide frame 174 to be slidable in the convey direction of a processing target member 19. The bearing 173 is biased to the left by a compression spring 175, and its left side surface is abutted against the distal end of a plunger 176. Thus, the bearing 173 is positioned. A thread to threadably engage with the thread of a through hole formed in the guide frame 174 is formed on the outer circumferential surface of the plunger 176. Upon reception of a rotating force from a motor 177, the plunger 176 is moved back and forth with respect to the guide frame 174. The support shaft 172, the bearing 173, the guide frame 174, the compression spring 175, the plunger 176, and the motor 177 constitute a skew-correcting moving mechanism 170 and are supported on a support table 171. Note that no moving mechanism is provided on the other end of the support shaft 172, and skew correction is performed only by movement of one end of the support shaft 172.

Registration marks are formed on the two sides of the printed circuit board member 19, as shown in FIG. 21B. Accordingly, a pair of sensors 165 for reading the registration marks are arranged at two positions to be separated from each other in a direction perpendicular to the convey direction of the printed circuit board member 19. Detection outputs from the two sensors 165 are sent to a sensor signal processing circuit 168, and signals indicating the positions of the marks, i.e., the position of the printed circuit board member and the inclined state of the printed circuit board member, are obtained. A central control circuit 180 outputs necessary instructions upon reception of these signals.

When it is detected that the printed circuit board member has inclination, i.e., a skew, a correction signal circuit 181 generates a signal for controlling a motor driver 182. This signal rotates the motor 177 to correct the skew. Registration other than skew correction is performed, upon reception of an instruction of the central control circuit 180, by causing a raster image signal generating circuit 102 to generate a raster image signal which has been subjected to position correction in the feed direction of the printed circuit board member and in a direction perpendicular to the feed direction.

According to the etching resist pattern forming apparatus described above, after an etching resist pattern is formed on one surface of the printed circuit board member, assume that another etching resist pattern is to be formed on the other surface of the printed circuit board member to be registered with the first etching resist pattern formed on one surface. In this case, the roll position of the printed circuit board member wound in the roll manner and having one surface on which the etching resist pattern or a circuit pattern has been formed, is moved when a displacement occurs in the skew direction with respect to the scanning direction of the print head, so that the skew is corrected and registration can be performed.

Therefore, with the above arrangement, a resist pattern forming apparatus for a two-sided printed circuit board member, which has a high-precision registration mechanism including that for skew correction, can be realized.

An apparatus according to the 14th embodiment, which enables correction of registration of the etching resist patterns on the two surfaces of the printed circuit board member by utilizing the registration mark formed on the printed circuit board member, will be described with reference to FIG. 24.

The apparatus shown in FIG. 24 has, in addition to the arrangement of the etching resist pattern forming apparatus described with reference to FIG. 22, two sensors, a roll supporting/feeding means, a guide means, and a control means. Near a hot-melt pressure contact transfer unit of the convey path of the flexible printed circuit board member, the two sensors are arranged to be separated from each other in a direction perpendicular to the feed direction of the printed circuit board member and to read the registration mark formed on one surface of the printed circuit board member. The roll supporting/feeding means supports and feeds the printed circuit board member wound in a roll manner and having one surface on which an etching resist pattern and a registration mark are formed. The guide means is arranged on the upstream side of the hot-melt transfer station. One end portion of the guide means is movable in a direction to intersect the feed direction of the printed circuit board member. The guide means is in contact with the printed circuit board member. The control means moves one end portion of the guide means based on detection signals sent from the sensors.

FIG. 24 shows portions only which are added to the embodiment of FIG. 22 or 23, or which are obtained by altering the embodiment of FIG. 22 or 23. Referring to FIG. 24, reference numeral 184 denotes a guide roller serving as a guide means provided on the upstream side of a hot-melt pressure contact transfer unit 116 along the convey path of a flexible printed circuit board member 19. The guide roller 184 is coaxially fixed to a roller shaft 185 and is rotatably supported by a bearing 186. The bearing 186 is housed in a guide frame 187 to be slidable in the vertical direction. The bearing 186 is positioned as it is urged against the lower end of a plunger 189 by the upward reaction force of a compression spring 188 provided under it. A thread is formed on the outer circumferential surface of the plunger 189 so that the plunger 189 is screwed into the guide frame 187. When a motor 190 is rotated, the plunger 189 is moved back and forth.

A bearing on the other end of the roller shaft 185 is fixed and does not slide. When the guide roller 184 is on the other end of the roller shaft 185, the guide roller 184 serving as the guide means is located at such a position that it slightly pushes up the convey path of the printed circuit board member, thereby flexing the printed circuit board member. When the shaft 185 on the slidable bearing side is moved, the flex amount of the convey path of the printed circuit board member on the slidable bearing side is changed. The skew is corrected by changing the flex amount.

A signal used for correction is generated substantially in the same manner as that of the embodiment shown in FIG. 23, and the embodiment of FIG. 24 is different from that shown in FIG. 23 only in a mechanical unit portion used for skew correction. More specifically, referring to FIG. 23, a registration mark position is calculated by the sensor signal processing circuit 168 based on detection signals sent from the pair of sensors 165. Upon reception of these output signals, the central control circuit 180 outputs an instruction signal to the control signal circuit 181 which controls the motor driver 182 for operating the skew correcting mechanism.

In FIG. 24, a motor driver 182 drives the motor 190 to move one end of the guide roller 184. As a result, the length of the convey path of the flexible printed circuit board member differs in its right and left sides, so that the inclination of the flexible printed circuit board member in the pressure contact transfer unit 116 can be changed and adjusted.

According to the etching resist pattern forming apparatus described above, a guide means having one end portion movable in a direction intersecting the feed direction of the printed circuit board member is provided. Thus, after an etching resist pattern is formed on one surface of the printed circuit board member, when another etching resist pattern is to be formed on the other surface of the printed circuit board member to be registered with the first etching resist pattern on one surface, the guide means is inclinedly moved to differ the length of the convey path of the printed circuit board member on the right side from that in the left side. Therefore, the skew can be corrected while the holding position of the rolled printed circuit board member is fixed.

Therefore, with the above arrangement, the skew correcting mechanism of the printed circuit board etching resist pattern forming apparatus can be simplified. Also, a skew correcting means, that can continuously perform etching resist pattern formation on one and the other surfaces of the printed circuit board member with a series of units without taking up the printed circuit board member in the roll manner, can be provided by connecting two etching resist pattern forming apparatuses in series.

An apparatus according to the 15th embodiment will be described with reference to FIG. 25. This apparatus is obtained providing, to the two-sided etching resist pattern forming apparatus shown in FIG. 22, a mechanism which electrically corrects registration, including skew correction, of the patterns on the two sides of the printed circuit board member without using a mechanical correcting mechanism.

This mechanical arrangement of this apparatus is the same as that of the apparatus described with reference to FIG. 22. However, note that this apparatus is provided with two sensors and an operational circuit. Near the hot-melt pressure contact transfer unit of the convey path of the printed circuit board member, the two sensors are arranged to be separated from each other in a direction perpendicular to the feed direction of the printed circuit board member and to read a registration mark formed on one surface of the printed circuit board member. The operational circuit performs coordinate conversion of the printed circuit pattern diagram in response to read signals sent from the two sensors.

More specifically, in this apparatus, a sensor signal processing circuit 168 for receiving detection signals from two sensors 165 sends information on a position and inclination of a printed circuit board member 19 to a central control circuit 169 and a skew correction circuit 171. A printed circuit pattern diagram generating means 101 is a circuit for generating and outputting a circuit pattern diagram in the form of a vector signal. Accordingly, coordinate conversion of the inclination direction as the output from the circuit pattern diagram generating means 101 can be performed very easily. Therefore, the skew correction calculation circuit 171 is a coordinate conversion calculation circuit of a vector circuit pattern diagram signal.

Correction calculation for registration in the feed direction of the printed circuit board member and in a direction perpendicular to the feed direction can also be performed by this coordinate conversion calculation circuit 171 simultaneously, or can be performed by a raster image signal generating circuit 102 connected to the output of the calculation circuit 171. Registration in the feed direction of the printed circuit board member and in the direction intersecting the feed direction only accompanies movement for registration of the raster data and does not require complicated calculation that changes the contents of the pattern data. Therefore, registration correction can be added easily. An instruction for this is output from the central control circuit 169.

According to the etching resist pattern forming apparatus described above, after an etching resist pattern is formed on one surface of the printed circuit board member, when another etching resist pattern is to be formed on the other surface to register with the first etching resist pattern, a registration mark is formed on one surface together with the first etching resist pattern. This registration mark is detected before forming another etching resist pattern on the other surface in order to obtain a difference between the scanning position of a print head used for forming the resist pattern on the other surface and the coordinate position of the pattern which is already formed on one surface. Coordinate conversion of the printed circuit pattern diagram is performed to eliminate this difference. Thus, the pattern diagrams on the two surfaces can be registered without using a mechanical adjusting means.

With the etching resist pattern diagram forming apparatus described above, resist patterns for a two-sided printed circuit board member can be formed at high precision with an apparatus having a simplified mechanism.

According to the present invention, the operation can be performed without requiring professional knowledge or skills, consumption of expensive materials for an intermediate product is eliminated, a preparation period is greatly shortened, and a waste liquid and waste that can pollute the environment can be prevented from being produced. Furthermore, expensive large-sized facilities necessary for an intermediate product is unnecessary, and thus cost for maintenance and management of such equipment can be economized.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A processing method based on resist pattern formation, comprising:
   (a) forming an electrostatic latent image on a recording medium;
   (b) forming a toner image on said recording medium by developing the electrostatic latent image with a hot-melt toner;
   (c) transferring the toner image on the recording medium onto a processing target member, said target member being made of a metal material capable of being dissolved by an etchant, in accordance with hot-melt transfer; and
   (d) processing the processing target member having the toner image thereon as a resist pattern, comprising selectively etching a surface of the processing target member on which the resist pattern has been hot-melt transferred and fixed, thereby providing a fused and a fixed toner image.

2. A method according to claim 1, further comprising, after the etching step, a step of removing the resist pattern from the surface of the processing target member by dissolving or melting.

3. A method according to claim 2, wherein the removing step includes the steps of setting the resist pattern in a molten state by heating, and urging a cleaning member against the resist pattern, thereby removing the resist pattern in accordance with adhesion transfer.

4. A method according to claim 2, wherein the removing step includes a step of causing an organic solvent, which dissolves the resist pattern, but does not melt the processing target member, to act on the resist pattern, thereby removing the resist pattern.

5. A method according to claim 2, wherein the removing step includes the steps of softening the resist pattern in a solution heated to a temperature not less than a temperature at which the resist pattern is softened, and applying a physical force to the resist pattern, thereby removing the resist pattern.

6. A method according to claim 1, wherein said recording medium is flexible, and the transferring step includes the steps of placing a surface of said flexible recording medium on a surface of the processing target member, and transferring the toner image onto the processing target member by hot-melt transfer while causing an elastic pressure contact force to act on said flexible recording medium and the processing target member.

7. A method according to claim 1, wherein the transferring step includes a first step of transferring the toner image formed on said recording medium onto an intermediate transfer medium, and a second step of contacting the toner image on the intermediate transfer medium to the processing target member in a molten state, so that the toner image is transferred to the processing target.

8. A method according to claim 7, wherein said recording medium has a rigid surface, said intermediate transfer medium includes a flexible intermediate transfer medium, the first step includes a step of transferring the toner image formed on said rigid surface onto the flexible intermediate transfer medium, and the second step includes a step of performing hot-melt transfer of the toner image while causing an elastic pressure contact force to act on said flexible intermediate transfer medium and the processing target member.

9. A method according to claim 1, wherein the transferring step further includes the steps of heating the processing target member, and bringing the toner image in a molten state and the processing target member into pressure contact at an elastic pressure contact force, thereby hot-melt-transferring the toner image onto a surface of the processing target.

10. A method according to claim 9, wherein the heating step heats both said recording medium on which the toner image is formed and the processing target member.

11. A method according to claim 1, wherein the etchant is selected from the group consisting of ferric chloride and cupric chloride.

12. A method according to claim 1, wherein the metal material of the target member is selected from the group consisting of a nickel-plated copper plate, an iron plate, a nickel plate and a stainless steel plate.

13. A method according to claim 12, wherein the metal material of the target member is selected from the group consisting of a nickel-plated copper plate, an iron plate, a nickel plate and a stainless steel plate.

14. A printed circuit board etching resist pattern forming apparatus comprising:
   means for generating a printed circuit pattern signal;
   a recording medium;
   means for forming an electrostatic latent image on said recording medium in accordance with the pattern signal;
   means for forming a toner image by developing the electrostatic latent image with a hot-melt-toner;
   means for supporting and conveying the toner image to a hot-melt transfer station;
   means for conveying a printed circuit board member including an insulating substrate and a metal foil laminated thereon to said hot-melt transfer station;
   means for heating the toner image on said conveying means to hot-melt-transfer, at a hot-melt transfer station, the toner image onto the metal foil of the printed circuit board member.

15. An apparatus according to claim 14, wherein said hot-melt transfer means includes pressure contact means for causing said toner image conveying means and the printed circuit board member to be brought into pressure contact with and to separate from each other, said apparatus further comprising control means for controlling said pressure contact means to separate said toner image conveying means and the printed circuit board member from each other at least when an edge of the printed circuit board member passes said transfer station.

16. An apparatus according to claim 15, wherein said control means includes, on an upstream side of said transfer station to which the printed circuit board member is conveyed, sensor means for detecting presence/absence of a printed circuit board member and for outputting a detection signal corresponding to presence/absence of the printed circuit board, and pressure contact and separation of said pressure contact means are controlled based on the detection signal sent from said sensor means.

17. An apparatus according to claim 16, further comprising means for controlling said printed circuit board conveying means such that conveyance of the printed circuit board is temporarily stopped at the upstream side of said transfer station based on the detection signal sent from said sensor means, and such that conveyance of the printed circuit board is resumed in synchronism with movement of the toner image by said toner image conveying means.

18. An apparatus according to claim 16, wherein said control means controls said toner image conveying means and said printed circuit board member conveying means based on the detection signal sent from said printed circuit board member sensor, such that said conveying means and said printed circuit board member are separated from each other at said transfer station, conveyance of the printed circuit board member is temporarily stopped when a distal end edge portion of the printed circuit board member passes said transfer station, said toner image conveying means and the printed circuit board member are brought into pressure contact with each other when a distal end of the toner image on said toner image conveying means is moved to said transfer station, and conveyance of the printed circuit board member is resumed after this.

19. An apparatus according to claim 18, wherein said electrostatic latent image forming means includes an optical write head which operates in response to a pattern diagram signal, said electrostatic latent image forming means includes an electrophotographic photosensitive body on which an electrostatic latent image is formed by said optical write head.

20. An apparatus according to claim 14, further comprising, at a position corresponding to a widthwise edge portion of the printed circuit board member in said transfer station between the printed circuit board member and said toner image conveying means, means for supplying a protection film in order to protect said conveying means.

21. An apparatus according to claim 14, wherein said electrostatic latent image forming means includes an optical write head which operates in response to a pattern diagram signal, said electrostatic latent image forming means includes an electrophotographic photosensitive body on which an electrostatic latent image is formed by said optical write head, said toner image conveying means includes an intermediate transfer belt which is supplied from a roll and onto which a toner image is transferred from said electrophotographic photosensitive body, and said transfer means includes means for melting the toner image on said transfer belt by heating and hot-melt-transferring the toner image onto the printed circuit board member.

22. An apparatus according to claim 14, further comprising a circuit for generating a print image signal by synthesizing a registration mark signal with a circuit pattern diagram signal, and wherein said electrostatic latent image forming means includes a print head which is driven based on the print image signal and forms an electrostatic latent image based on a printed circuit pattern on recording medium and a pattern electrostatic latent image based on a registration mark on said recording medium outside a region of the printed circuit pattern.

23. An apparatus according to claim 22, further comprising sensor means, provided on an upstream side of said hot-melt transfer station for reading the registration mark on one surface of the printed circuit board member and for outputting a read signal, and means for controlling a position to form an etching resist pattern which is to be formed on the outer surface of the printed circuit board member based on the read signal from said sensor means.

24. An apparatus according to claim 23, wherein said sensor means includes two sensors which are arranged to separate from each other in a direction perpendicular to a feed direction of the printed circuit board member, and said printed circuit board member convey means includes a roll support unit, including a skew-correcting moving mechanism, for supporting the printed circuit board member wound in a roll manner and having one surface on which an etching resist pattern and a registration mark are formed, said apparatus further comprising a control circuit for controlling said skew-correcting moving mechanism based on detection outputs from said sensors.

25. An apparatus according to claim 23, wherein said sensor means includes two sensors which are arranged to separate from each other in a direction perpendicular to a feed direction of the printed circuit board member, said printed circuit board member conveying means includes roll supporting/feeding means for supporting and feeding the printed circuit board member wound in a roll manner and having one surface on which an etching resist pattern and a registration mark are formed, said apparatus further comprising guide means and control means, said guide means being arranged on an upstream side of said hot-melt transfer station, having one end portion which is movable in a direction to intersect the feed direction of the printed circuit board member, and being in contact with the printed circuit board member, said control means serving to move said one end portion of said guide means based on detection signals from said sensors.

26. An apparatus according to claim 23, wherein said sensor means includes two sensors which are arranged to separate from each other in a direction perpendicular to a feed direction of the printed circuit board member, said apparatus further comprising an operation circuit which operates in response to read signals from said sensors and performs coordinate conversion of a printed circuit pattern diagram.

27. An apparatus according to claim 14 wherein said supporting and conveying means comprises said recording medium.

28. An apparatus according to claim 14 wherein said supporting and conveying means comprises said recording medium, an intermediate transfer medium and means for transferring the toner image to the intermediate transfer medium from the recording medium.

* * * * *